US010170324B2

(12) United States Patent
Dole et al.

(10) Patent No.: US 10,170,324 B2
(45) Date of Patent: *Jan. 1, 2019

(54) TECHNIQUE TO TUNE SIDEWALL PASSIVATION DEPOSITION CONFORMALITY FOR HIGH ASPECT RATIO CYLINDER ETCH

(71) Applicant: Lam Research Corporation, Fremont, CA (US)

(72) Inventors: Nikhil Dole, Union City, CA (US); Eric A. Hudson, Berkeley, CA (US); George Matamis, Danville, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/449,799

(22) Filed: Mar. 3, 2017

(65) Prior Publication Data

US 2017/0178920 A1 Jun. 22, 2017

Related U.S. Application Data

(63) Continuation-in-part of application No. 15/157,303, filed on May 17, 2016, which is a continuation of
(Continued)

(51) Int. Cl.
*H01L 21/3065* (2006.01)
*H01L 21/67* (2006.01)
(Continued)

(52) U.S. Cl.
CPC .. *H01L 21/30655* (2013.01); *H01J 37/32091* (2013.01); *H01J 37/32137* (2013.01);
(Continued)

(58) Field of Classification Search
CPC ........... H01L 21/0365; H01L 21/30655; H01L 21/31116; H01L 21/31138; H01L 27/108;
(Continued)

(56) References Cited

U.S. PATENT DOCUMENTS 4,894,696 A  1/1990 Takeda
5,514,246 A  5/1996 Blalock
(Continued)

FOREIGN PATENT DOCUMENTS

JP  2011-086966  8/2014
KR  10-2006-0030717  4/2006

OTHER PUBLICATIONS

U.S. Office Action, dated May 11, 2017, issued in U.S. Appl. No. 15/157,303.
(Continued)

*Primary Examiner* — Duy Vu N Deo
(74) *Attorney, Agent, or Firm* — Weaver Austin Villeneuve & Sampson LLP

(57) ABSTRACT

Methods, apparatus and systems for forming a recessed feature in dielectric material on a semiconductor substrate are provided. Separate etching and deposition operations are employed in a cyclic manner. Each etching operation partially etches the feature. Each deposition operation forms a protective film on the sidewalls of the feature to prevent lateral etch of the dielectric material during the etching operations. The protective film may be deposited under different conditions (e.g., pressure, duration of reactant delivery, duration of plasma exposure, RF power, and/or RF duty cycle, etc.) in different deposition operations. Such conditions may affect the degree of conformality at which the protective film forms. In various embodiments, one or
(Continued)

more protective films may be sub-conformal. In these or other embodiments, one or more other protective films may be conformal.

23 Claims, 13 Drawing Sheets

Related U.S. Application Data application No. 14/560,414, filed on Dec. 4, 2014, now Pat. No. 9,378,971.

(51) Int. Cl.
*H01J 37/32* (2006.01)
*H01L 21/311* (2006.01)
*H01L 21/02* (2006.01)

(52) U.S. Cl.
CPC .. *H01J 37/32889* (2013.01); *H01J 37/32899* (2013.01); *H01L 21/31116* (2013.01); *H01L 21/67069* (2013.01); *H01J 2237/334* (2013.01); *H01J 2237/3321* (2013.01); *H01J 2237/3347* (2013.01); *H01L 21/0217* (2013.01); *H01L 21/0228* (2013.01); *H01L 21/02112* (2013.01); *H01L 21/02164* (2013.01); *H01L 21/02271* (2013.01); *H01L 21/02274* (2013.01)

(58) Field of Classification Search
CPC ............. H01L 27/115; H01L 37/32009; H01L 37/32449; H01L 37/32899; C23C 16/45544; C23C 16/50; C23C 16/52
See application file for complete search history.

(56) References Cited

U.S. PATENT DOCUMENTS

| | | | |
|---|---|---|---|
| 5,767,018 A | 6/1998 | Bell | |
| 5,948,704 A | 9/1999 | Benjamin et al. | |
| 6,063,710 A | 5/2000 | Kadomura et al. | |
| 6,176,667 B1 | 1/2001 | Fairbairn et al. | |
| 6,841,943 B2 | 1/2005 | Vahedi et al. | |
| 6,916,746 B1 | 7/2005 | Hudson et al. | |
| 7,105,390 B2 | 9/2006 | Brask et al. | |
| 7,138,677 B2 | 11/2006 | Gutsche et al. | |
| 7,294,580 B2 | 11/2007 | Yun et al. | |
| 7,732,728 B2 | 6/2010 | Dhindsa et al. | |
| 7,740,736 B2 | 6/2010 | Fischer et al. | |
| 7,951,683 B1 | 5/2011 | Shanker | |
| 7,977,390 B2* | 7/2011 | Ji | H01L 21/31144 216/37 |
| 8,552,334 B2 | 10/2013 | Tappan et al. | |
| 9,378,971 B1* | 6/2016 | Briggs | H01L 21/30655 |
| 9,384,998 B2* | 7/2016 | Hudson | H01L 21/31116 |
| 9,385,318 B1 | 7/2016 | Henri | |
| 9,543,148 B1 | 1/2017 | Hudson et al. | |
| 9,543,158 B2* | 1/2017 | Hudson | H01L 21/30655 |
| 9,548,188 B2 | 1/2017 | Hausmann | |
| 9,620,377 B2* | 4/2017 | Hudson | H01L 21/30655 |
| 9,887,097 B2* | 2/2018 | Hudson | H01L 21/31138 |
| 9,997,372 B2 | 6/2018 | Briggs et al. | |
| 9,997,373 B2 | 6/2018 | Hudson | |
| 2003/0003755 A1 | 1/2003 | Donohoe | |
| 2004/0224520 A1 | 11/2004 | Yun et al. | |
| 2005/0032388 A1 | 2/2005 | Donohoe | |
| 2005/0136682 A1* | 6/2005 | Hudson | H01L 21/31116 438/714 |
| 2005/0218114 A1 | 10/2005 | Yue et al. | |
| 2006/0121721 A1 | 6/2006 | Lee et al. | |
| 2007/0026677 A1 | 2/2007 | Ji et al. | |
| 2008/0286978 A1 | 11/2008 | Chen et al. | |
| 2009/0163035 A1 | 6/2009 | Romano et al. | |
| 2009/0203218 A1 | 8/2009 | Matsuyama et al. | |
| 2009/0275202 A1 | 11/2009 | Tanaka et al. | |
| 2010/0009543 A1 | 1/2010 | Cho | |
| 2010/0173494 A1 | 7/2010 | Kobrin | |
| 2010/0178770 A1 | 7/2010 | Zin | |
| 2011/0201208 A1 | 8/2011 | Kawakami et al. | |
| 2013/0316518 A1 | 11/2013 | Hollister et al. | |
| 2014/0038412 A1 | 2/2014 | Hu et al. | |
| 2014/0043216 A1 | 2/2014 | Tang | |
| 2014/0065838 A1 | 3/2014 | Ellinger et al. | |
| 2014/0083978 A1 | 3/2014 | Mahadeswaraswamy et al. | |
| 2015/0083582 A1 | 3/2015 | Dhindsa et al. | |
| 2016/0163556 A1 | 6/2016 | Briggs et al. | |
| 2016/0163557 A1 | 6/2016 | Hudson et al. | |
| 2016/0163558 A1 | 6/2016 | Hudson et al. | |
| 2016/0163561 A1 | 6/2016 | Hudson et al. | |
| 2016/0181117 A1 | 6/2016 | Arghavani et al. | |
| 2016/0260617 A1 | 9/2016 | Hudson et al. | |
| 2016/0260620 A1 | 9/2016 | Briggs et al. | |
| 2016/0268141 A1 | 9/2016 | Hudson | |
| 2016/0343580 A1 | 11/2016 | Hudson | |
| 2016/0379856 A1 | 12/2016 | Tomura et al. | |
| 2017/0033119 A1 | 2/2017 | Park et al. | |
| 2017/0076945 A1 | 3/2017 | Hudson et al. | |
| 2017/0076955 A1 | 3/2017 | Hudson et al. | |
| 2017/0170026 A1 | 6/2017 | Hudson et al. | |
| 2018/0174858 A1 | 6/2018 | Hudson | |

OTHER PUBLICATIONS

U.S. Final Office Action, dated Sep. 28, 2017, issued in U.S. Appl. No. 15/157,303.
U.S. Notice of Allowance dated Feb. 13, 2018, issued in U.S. Appl. No. 15/157,303.
U.S. Office Action, dated May 12, 2017, issued in U.S. Appl. No. 15/163,123.
U.S. Notice of Allowance, dated Sep. 26, 2017, issued in U.S. Appl. No. 15/163,123.
U.S. Office Action, dated Aug. 4, 2017, issued in U.S. Appl. No. 15/225,489.
U.S. Final Office Action, dated Dec. 21, 2017, issued in U.S. Appl. No. 15/225,489.
U.S. Notice of Allowance, dated Feb. 9, 2018, issued in U.S. Appl. No. 15/225,489.
PCT International Search Report and Written Opinion dated Nov. 9, 2017 issued in PCT/US2017/044986.
Engelhardt et al. (1988) "Deep Trench Etching Using CBrF$_3$ and CBrF$_3$/Chlorine Gas Mixtures," *Siemens AG*, Otto-Hahn-Ring, 8000 Munich 83, Germany, pp. 48-54.
Matsuo (May 1, 1980) "Selective etching of Si relative to SiO$_2$ without undercutting by CBrF$_3$ plasma," *Applied Physics Letters*, 36(9):768-770.
Ohiwa et al. (1990) "SiO2 Tapered Etching Employing Magnetron Discharge," *1990 Dry Process Symposium*, ULSI Research Center, Toshiba Corp., V-3, pp. 105-109.
Ohiwa et al. (Feb. 1992) "SiO2 Tapered Etching Employing Magnetron Discharge of Fluorocarbon Gas," *Jpn. J. Appl. Phys.*, 31(Part 1, 2A):405-410.
U.S. Appl. No. 15/475,021, filed Mar. 30, 2017, Hudson et al.
U.S. Appl. No. 15/667,551, filed Aug. 2, 2017, Eason et al.
U.S. Appl. No. 15/798,831, filed Oct. 31, 2017, Belau et al.
U.S. Appl. No. 15/820,110, filed Nov. 21, 2017, Zhou et al.
U.S. Appl. No. 15/846,018, filed Dec. 18, 2017, Hudson.
U.S. Office Action, dated Feb. 5, 2018, issued in U.S. Appl. No. 15/475,021.
U.S. Office Action, dated Nov. 19, 2015, issued in U.S. Appl. No. 14/560,414.
U.S. Notice of Allowance, dated Apr. 6, 2016, issued in U.S. Appl. No. 14/560,414.
U.S. Office Action, dated Sep. 8, 2015, issued in U.S. Appl. No. 14/724,574.
U.S. Final Office Action, dated Dec. 18, 2015, issued in U.S. Appl. No. 14/724,574.

(56) References Cited

OTHER PUBLICATIONS

U.S. Notice of Allowance, dated Mar. 1, 2016, issued in U.S. Appl. No. 14/724,574.
U.S. Office Action, dated Jul. 11, 2016, issued in U.S. Appl. No. 14/697,521.
U.S. Notice of Allowance, dated Nov. 14, 2016, issued in U.S. Appl. No. 14/697,521.
U.S. Notice of Allowance (corrected Notice of Allowability), dated Dec. 5, 2016, issued in U.S. Appl. No. 14/697,521.
U.S. Office Action, dated Jul. 26, 2016, issued in U.S. Appl. No. 14/803,578.
U.S. Notice of Allowance, dated Dec. 5, 2016, issued in U.S. Appl. No. 14/803,578.
U.S. Office Action, dated Jun. 15, 2016, issued in U.S. Appl. No. 14/842,733.
U.S. Notice of Allowance, dated Nov. 9, 2016, issued in U.S. Appl. No. 14/842,733.
U.S. Notice of Allowance, dated Dec. 8, 2016, issued in U.S. Appl. No. 14/842,733.
Hanson et al. (2003) "Bonding Self-Assembled, Compact Organophosphonate Monolayers to the Native Oxide Surface of Silicon," *J. Am. Chem. Soc.*,125(51):16074-16080.
Jung et al. (2005) "Vapor-Phase Self-Assembled Monolayer for Improved Mold Release in Nanoimprint Lithography," *Langmuir*, 21(4):1158-1161.
Yang et al. (2006) "CVD Growth Kinetics of $HfB_2$ Thin Films from the Single-Source Precursor $Hf(BH_4)_4$," *Chem. Mater., American Chemical Society*, 18(21):5088-5096.
Yanguas-Gil et al. (Sep./Oct. 2009) "Highly conformal film growth by chemical vapor deposition. II. Conformality enhancement through growth inhibition," *Journal of Vacuum Science & Technology A*, 27(5): 1244-1248.
Zhuang et al. (2006) "Thermal stability of vapor phase deposited self-assembled monolayers for MEMS anti-stiction," *J. Micromech. Microeng.*, 16:2259-2264.
Zhou, Han and Bent, Stacey F. (Jul./Aug. 2013) "Fabrication of organic interfacial layers by molecular layer deposition: Present status and future opportunities," *Journal of Vacuum Science Technology A*, American Vacuum Society, 31(4), 040801-1-040801-18.
U.S. Appl. No. 15/364,101, filed Nov. 29, 2016, Hudson et al.
U.S. Appl. No. 14/446,427, filed Jul. 30, 2014, Hausmann.
U.S. Appl. No. 15/359,362, filed Nov. 22, 2016, Hudson et al.
U.S. Office Action dated Jul. 27, 2018, issued in U.S. Appl. No. 15/157,322.
U.S. Office Action dated Apr. 3, 2018 issued in U.S. Appl. No. 15/440,842.
International Search Report and Written Opinion dated Jun. 29, 2018 issued in PCT/US2018/022239.
U.S. Office Action dated Jun. 7, 2018, issued in U.S. Appl. No. 15/667,551.
U.S. Office Action, dated Sep. 18, 2018, issued in U.S. Appl. No. 15/364,101.
U.S. Notice of Allowance dated Sep. 4, 2018 issued in U.S. Appl. No. 15/440,842.
U.S. Office Action, dated Oct. 17, 2018, issued in U.S. Appl. No. 15/846,018.
International Search Report and Written Opinion dated Nov. 9, 2018 issued in PC/US2018/043967.

* cited by examiner

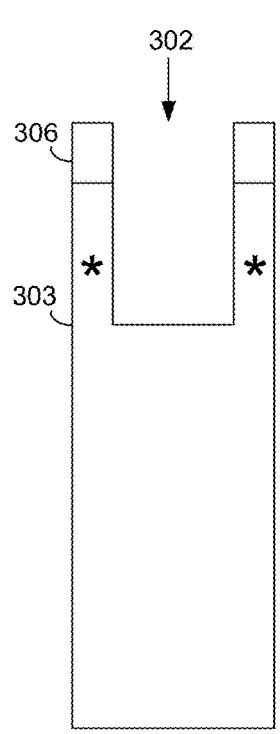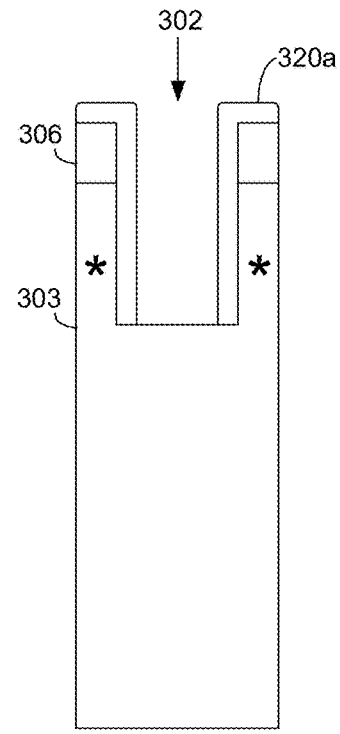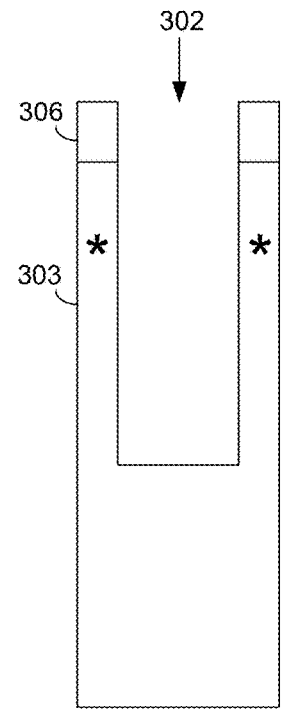
FIG. 3E  FIG. 3F  FIG. 3G
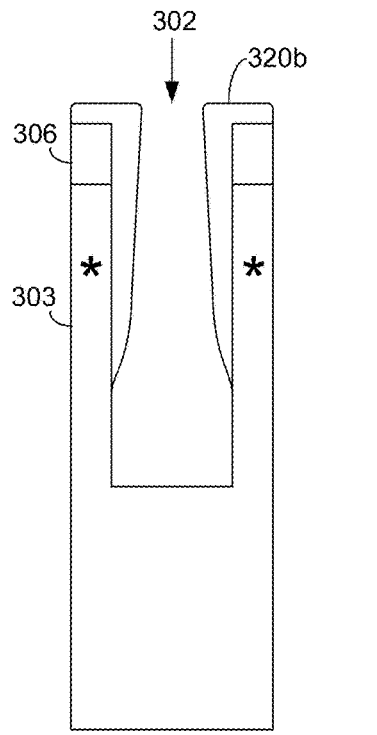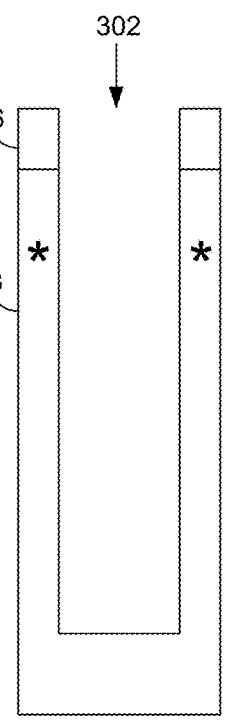
FIG. 3H  FIG. 3I Conformal Super-Conformal Sub-Conformal

TECHNIQUE TO TUNE SIDEWALL PASSIVATION DEPOSITION CONFORMALITY FOR HIGH ASPECT RATIO CYLINDER ETCH

CROSS-REFERENCE TO RELATED APPLICATIONS

This application is a continuation-in-part of U.S. patent application Ser. No. 15/157,303, filed May 17, 2016, and titled "TECHNIQUE TO DEPOSIT SIDEWALL PASSIVATION FOR HIGH ASPECT RATIO CYLINDER ETCH," which is a continuation of U.S. patent application Ser. No. 14/560,414 (now U.S. Pat. No. 9,378,971), filed Dec. 4, 2014, and titled "TECHNIQUE TO DEPOSIT SIDEWALL PASSIVATION FOR HIGH ASPECT RATIO CYLINDER ETCH," each of which is herein incorporated by reference in its entirety and for all purposes.

BACKGROUND

One process frequently employed during fabrication of semiconductor devices is formation of an etched cylinder in dielectric material. Example contexts where such a process may occur include, but are not limited to, memory applications such as DRAM and 3D NAND structures. As the semiconductor industry advances and device dimensions become smaller, such cylinders become increasingly harder to etch in a uniform manner, especially for high aspect ratio cylinders having narrow widths and/or deep depths.

SUMMARY

Certain embodiments herein relate to methods and apparatus for forming an etched feature in dielectric material on a semiconductor substrate. The disclosed embodiments may utilize certain techniques to deposit a protective film on sidewalls of the etched feature, thereby allowing etch to occur at high aspect ratios. Etching and deposition processes can be cycled until the feature is fully etched. In various embodiments, the deposition processes may be tuned such that earlier performed depositions and later performed depositions occur under different deposition conditions. In this way, the protective film deposited on the sidewalls of a partially etched feature can be tuned as desired as the feature is further etched. In one example, the conformality of the protective film may be tuned such that protective films deposited in different iterations have different levels of conformality. This difference in conformality permits the protective film to be deposited only in areas where it is most beneficial, for example where a bow is forming (or otherwise would be forming).

In one aspect of the disclosed embodiments, a method of forming an etched feature in a substrate including dielectric material is provided, the method including: (a) generating a first plasma including an etching reactant, exposing the substrate to the first plasma, and partially etching the feature in the substrate; (b) after (a), depositing a protective film on sidewalls of the feature, where the protective film is deposited through a plasma assisted atomic layer deposition reaction including: (i) exposing the substrate to a first deposition reactant and allowing the first deposition reactant to adsorb onto the sidewalls of the feature; (ii) after (i), exposing the substrate to a second plasma including a second deposition reactant, where exposing the substrate to the second plasma drives a surface reaction between the first deposition reactant and the second deposition reactant, thereby forming the protective film on the sidewalls of the feature; and (c) repeating (a)-(b) until the feature is etched to a final depth, where the protective film deposited in (b) substantially prevents lateral etch of the feature during (a), and where the feature has an aspect ratio of about 5 or greater at its final depth.

In another aspect of the disclosed embodiments, an apparatus for forming an etched feature in a substrate including dielectric material is provided, the apparatus including: one or more reaction chambers, where at least one reaction chamber is designed or configured to perform etching, and where at least one reaction chamber is designed or configured to perform deposition, each reaction chamber including: an inlet for introducing process gases to the reaction chamber, an outlet for removing material from the reaction chamber, and a plasma source; and a controller having instructions for: (a) generating a first plasma including an etching reactant, exposing the substrate to the first plasma, and partially etching the feature in the substrate, where (a) is performed in the reaction chamber designed or configured to perform etching; (b) after (a), depositing a protective film on sidewalls of the feature, where the protective film is deposited through a plasma assisted atomic layer deposition reaction including: (i) exposing the substrate to a first deposition reactant and allowing the first deposition reactant to adsorb onto the sidewalls of the feature; (ii) after (i), exposing the substrate to a second plasma including a second deposition reactant, where exposing the substrate to the second plasma drives a surface reaction between the first deposition reactant and the second deposition reactant, thereby forming the protective film on the sidewalls of the feature, where (b) is performed in the reaction chamber designed or configured to perform deposition; and (c) repeating (a)-(b) until the feature is etched to a final depth, where the protective film deposited in (b) substantially prevents lateral etch of the feature during (a), and where the feature has an aspect ratio of about 5 or greater at its final depth.

In a further aspect of the disclosed embodiments, a method of forming an etched feature in a substrate including dielectric material is provided, the method including: (a) generating a first plasma including an etching reactant, exposing the substrate to the first plasma, and partially etching the feature in the substrate; (b) after (a), depositing a protective film on sidewalls of the feature; and (c) repeating (a)-(b) until the feature is etched to a final depth, where the feature has an aspect ratio of about 5 or greater at its final depth, and where the protective film deposited in a first iteration of (b) is more conformal than the protective film deposited in a second iteration of (b).

In some embodiments, the first iteration of (b) may be performed before the second iteration of (b). In other embodiments, the first iteration of (b) may be performed after the second iteration of (b). The protective film deposited in the first iteration of (b) may be conformal and the protective film deposited in the second iteration of (b) may be sub-conformal. In some such cases, the protective film deposited in the second iteration of (b) may not extend to a bottom of the partially etched feature.

In various embodiments, the protective film deposited in the first iteration of (b) may be deposited under different conditions compared to the protective film deposited in the second iteration of (b). In one example, the protective film deposited in the first iteration of (b) may be deposited at a higher pressure compared to the protective film deposited in the second iteration of (b). In these or other examples, the protective film deposited in the first iteration of (b) may be deposited at a lower rate of reactant delivery compared to the protective film deposited in the second iteration of (b). In these or other examples, the protective film deposited in the first iteration of (b) may be deposited at a shorter duration of reactant delivery compared to the protective film deposited in the second iteration of (b). In these or other examples, the protective film deposited in the first iteration of (b) may be deposited at a shorter duration of plasma exposure compared to the protective film deposited in the second iteration of (b). In these or other examples, the protective film deposited in the first iteration of (b) may be deposited at a higher RF power compared to the protective film deposited in the second iteration of (b). In these or other examples, the protective film deposited in the first iteration of (b) may be deposited at a higher RF duty cycle compared to the protective film deposited in the second iteration of (b). In various embodiments, the protective film deposited in the first iteration of (b) may be deposited using a first set of deposition conditions, the protective film deposited in the second iteration of (b) may be deposited using a second set of deposition conditions, and the first and second sets of deposition conditions may be different with respect to at least two parameters selected from the group consisting of: pressure, rate of reactant delivery, duration of reactant delivery, duration of plasma exposure, RF power, and RF duty cycle. In some such embodiments, the first set of deposition conditions may have a lower rate of reactant delivery and either (i) a shorter duration of reactant delivery, and/or (ii) a shorter duration of plasma exposure.

In some implementations, at least one iteration of (a) may result in formation of a bow within the feature, and a subsequent iteration of (b) may result in formation of the protective film at least as deep as the bow, but not as deep as the feature. The protective film may be deposited through a number of different techniques. In one example, the protective film may be deposited via a thermal atomic layer deposition reaction or a plasma assisted atomic layer deposition reaction. In another example, the protective film may be deposited via a molecular layer deposition reaction. In another example, the protective film may be deposited via a self-assembled monolayer reaction. In another example, the protective film may be deposited via a thermal chemical vapor deposition reaction or a plasma enhanced chemical vapor deposition reaction.

In a further aspect of the disclosed embodiments, an apparatus for forming an etched feature in a substrate including dielectric material is provided, the apparatus including: one or more reaction chambers, where at least one reaction chamber is designed or configured to perform etching, and where at least one reaction chamber is designed or configured to perform deposition, each reaction chamber including: an inlet for introducing process gases to the reaction chamber, and an outlet for removing material from the reaction chamber, and a controller having instructions for: (a) generating a first plasma including an etching reactant, exposing the substrate to the first plasma, and partially etching the feature in the substrate, where (a) is performed in the reaction chamber designed or configured to perform etching; (b) after (a), depositing a protective film on sidewalls of the feature, where (b) is performed in the reaction chamber designed or configured to perform deposition; and (c) repeating (a)-(b) until the feature is etched to a final depth, where the feature has an aspect ratio of about 5 or greater at its final depth, and where the protective film deposited in a first iteration of (b) is more conformal than the protective film deposited in a second iteration of (b).

In some embodiments, the reaction chamber designed or configured to perform etching may be the same reaction chamber designed or configured to perform deposition, such that both (a) and (b) occur in the same reaction chamber. In some other embodiments, the reaction chamber designed or configured to perform etching may be different from the reaction chamber designed or configured to perform deposition, and the controller may further include instructions to transfer the substrate between the reaction chamber designed or configured to perform etching and the reaction chamber designed or configured to perform deposition.

These and other features will be described below with reference to the associated drawings.

BRIEF DESCRIPTION OF THE DRAWINGS

FIGS. 3E-3I show etched cylinders in a semiconductor substrate as the cylinders are cyclically etched and coated with a protective sidewall coating, where the protective sidewall coating is deposited at different degrees of conformality in different deposition iterations.

DETAILED DESCRIPTION

Figure 1:
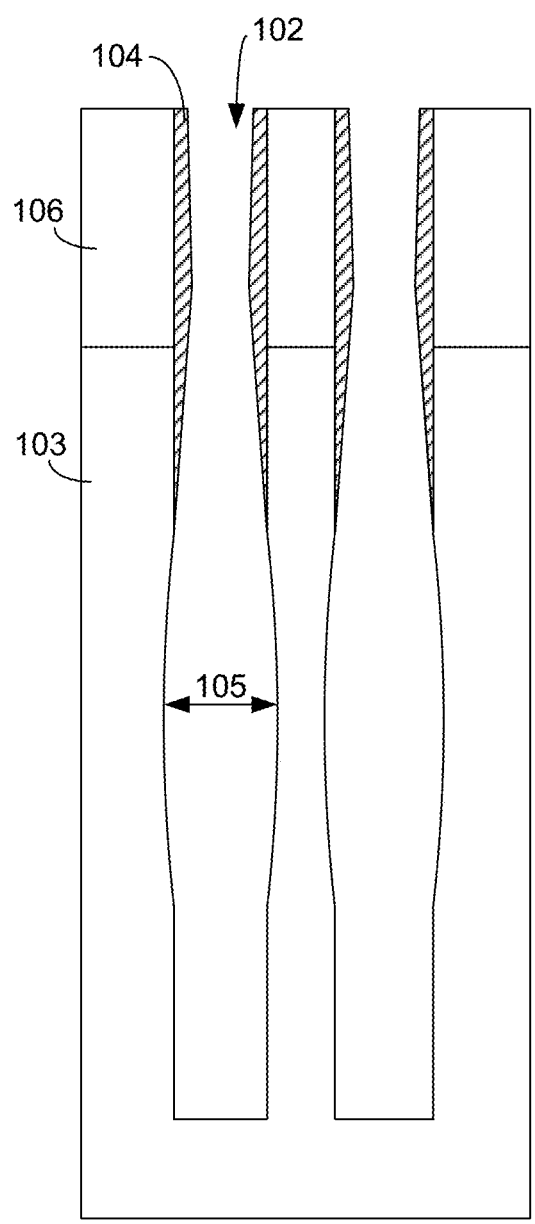
FIG. 1 illustrates an etched cylinder having an undesirable bow due to over-etching of the sidewalls.

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of this invention include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

I. Technology for Etching High Aspect Ratio Features in a Dielectric Material

Fabrication of certain semiconductor devices involves etching features into a dielectric material or materials. The dielectric material may be provided as a single layer of material or in a stack of materials. In some cases a stack includes alternating layers of dielectric material (e.g., silicon nitride and silicon oxide). One example etched feature is a cylinder, which may have a high aspect ratio. As the aspect ratio of such features continues to increase, it is increasingly challenging to etch the features into dielectric materials. One problem that arises during etching of high aspect ratio features is a non-uniform etching profile. In other words, the features do not etch in a straight downward direction. Instead, the sidewalls of the features are often bowed such that a middle portion of the etched feature is wider (i.e., further etched) than a top and/or bottom portion of the feature. This over-etching near the middle portion of the features can result in compromised structural and/or electronic integrity of the remaining material. The portion of the feature that bows outwards may occupy a relatively small portion of the total feature depth, or a relatively larger portion. The portion of the feature that bows outward is where the critical dimension (CD) of the feature is at its maximum. The critical dimension corresponds to the diameter of the feature at a given spot. It is generally desirable for the maximum CD of the feature to be about the same as the CD elsewhere in the feature, for example at or near the bottom of the feature.

Without being bound by any theory or mechanism of action, it is believed that the over-etching at the middle portion of the cylinder or other feature occurs at least partially because portions of the sidewalls of the cylinder are insufficiently protected from etching. Conventional etch chemistry utilizes fluorocarbon etchants to form the cylinders in the dielectric material. The fluorocarbon etchants are excited by plasma exposure, which results in the formation of various fluorocarbon fragments including, for example, CF, $CF_2$, and $CF_3$. Reactive fluorocarbon fragments etch away the dielectric material at the bottom of a feature (e.g., cylinder) with the assistance of ions. Other fluorocarbon fragments are deposited on the sidewalls of the cylinder being etched, thereby forming a protective polymeric sidewall coating. This protective sidewall coating promotes preferential etching at the bottom of the feature as opposed to the sidewalls of the feature. Without this sidewall protection, the feature begins to assume a non-uniform profile, with a wider etch/cylinder width where the sidewall protection is inadequate.

Sidewall protection is especially difficult to achieve in high aspect ratio features. One reason for this difficulty is that existing fluorocarbon-based processes cannot form the protective polymeric sidewall coating at locations in the cylinder that are being laterally over-etched. FIG. 1 presents a figure of a cylinder 102 being etched in a dielectric material 103 coated with a patterned mask layer 106. While the following discussion sometimes refers to cylinders, the concepts apply to other feature shapes such as rectangles and other polygons. A protective polymeric sidewall coating 104 is concentrated near the top portion of the cylinder 102. $C_xF_y$ chemistry provides both the etch reactant(s) for etching the cylinder vertically, as well as the reactant(s) that form the protective polymeric sidewall coating 104. Because the protective polymeric sidewall coating 104 does not extend sufficiently deep into the cylinder (i.e., there is insufficient deposition on the sidewall), the middle portion of the cylinder 102 becomes wider than the top and bottom portions of the cylinder 102. The wider middle portion of the cylinder 102 is referred to as the bow 105. The bow can be numerically described in terms of a comparison between the critical dimension of the feature at the bow region (the relatively wider region) and the critical dimension of the feature below the bow region (e.g., the bottom region of the feature). The bow may be numerically reported in terms of distance (e.g., the critical dimension at the widest part of the feature minus the critical dimension at the narrowest part of the feature below the bow) or in terms of a ratio/percent (the critical dimension at the widest part of the feature divided by the critical dimension at the narrowest part of the feature below the bow). This bow 105, and the related non-uniform etch profile, is undesirable. Because of the high ion energies often used in this type of etching process, bows are often created when etching cylinders of high aspect ratios. In some applications, bows are created even at aspect ratios as low as about 5. As such, conventional fluorocarbon etch chemistry is typically limited to forming relatively low aspect ratio cylinders in dielectric materials. Some modern applications require cylinders having higher aspect ratios than those that can be achieved with conventional etch chemistry.

II. Context and Applications

In various embodiments herein, features are etched in a substrate (typically a semiconductor wafer) having dielectric material on the surface. The dielectric material may be provided in a stack of materials. The etching processes are generally plasma-based etching processes. The overall feature formation process may occur in stages: one stage directed at etching the dielectric material and another stage directed at forming a protective sidewall coating without substantially etching the dielectric material. The protective sidewall coating passivates the sidewalls and prevents the feature from being over-etched (i.e., the sidewall coating prevents lateral etch of the feature). These two stages can be repeated until the feature is etched to its final depth. By cycling these two stages, the diameter of the feature can be controlled over the entire depth of the feature, thereby forming features having more uniform diameters/improved profiles.

A feature is a recess in the surface of a substrate. Features can have many different shapes including, but not limited to, cylinders, rectangles, squares, other polygonal recesses, trenches, etc.

Aspect ratios are a comparison of the depth of a feature to the critical dimension of the feature (often its width/diameter). For example, a cylinder having a depth of 2 μm and a width of 50 nm has an aspect ratio of 40:1, often stated more simply as 40. Since the feature may have a non-uniform critical dimension over the depth of the feature, the aspect ratio can vary depending on where it is measured. For instance, sometimes an etched cylinder may have a middle portion that is wider than the top and bottom portions. This wider middle section may be referred to as the bow, as noted above. An aspect ratio measured based on the critical dimension at the top of the cylinder (i.e., the neck) would be higher than an aspect ratio measured based on the critical dimension at the wider middle/bow of the cylinder. As used herein, aspect ratios are measured based on the critical dimension proximate the opening of the feature, unless otherwise stated.

The features formed through the disclosed methods may be high aspect ratio features. In some applications, a high aspect ratio feature is one having an aspect ratio of at least about 5, at least about 10, at least about 20, at least about 30, at least about 40, at least about 50, at least about 60, at least about 80, or at least about 100. The critical dimension of the features formed through the disclosed methods may be about 200 nm or less, for example about 100 nm or less, about 50 nm or less, or about 20 nm or less.

The material into which the feature is etched may be a dielectric material in various cases. Example materials include, but are not limited to, silicon oxides, silicon nitrides, silicon carbides, oxynitrides, oxycarbides, carbonitrides, doped versions of these materials (e.g., doped with boron, phosphorus, etc.), and laminates from any combinations of these materials. Particular example materials include stoichiometric and non-stoichiometric formulations of $SiO_2$, SiN, SiON, SiOC, SiCN, etc. The material or materials being etched may also include other elements, for example hydrogen in various cases. In some embodiments, a nitride and/or oxide material being etched has a composition that includes hydrogen. As used herein, it is understood that silicon oxide materials, silicon nitride materials, etc. include both stoichiometric and non-stoichiometric versions of such materials, and that such materials may have other elements included, as described above.

One application for the disclosed methods is in the context of forming a DRAM device. In this case, the feature may be etched primarily in silicon oxide. The substrate may also include one, two, or more layers of silicon nitride, for instance. In one example, a substrate includes a silicon oxide layer sandwiched between two silicon nitride layers, with the silicon oxide layer being between about 800-1200 nm thick and one or more of the silicon nitride layers being between about 300-400 nm thick. The etched feature may be a cylinder having a final depth between about 1-3 μm, for example between about 1.5-2 μm. The cylinder may have a width between about 20-50 nm, for example between about 25-30 nm. After the cylinder is etched, a capacitor memory cell can be formed therein.

Another application for the disclosed methods is in the context of forming a vertical NAND (VNAND, also referred to as 3D NAND) device. In this case, the material into which the feature is etched may have a repeating layered structure. For instance, the material may include alternating layers of oxide (e.g., $SiO_2$) and nitride (e.g., SiN), or alternating layers of oxide (e.g., $SiO_2$) and polysilicon. The alternating layers form pairs of materials. In some cases, the number of pairs may be at least about 20, at least about 30, at least about 40, at least about 60, or at least about 70. The oxide layers may have a thickness between about 20-50 nm, for example between about 30-40 nm. The nitride or polysilicon layers may have a thickness between about 20-50 nm, for example between about 30-40 nm. The feature etched into the alternating layer may have a depth between about 2-6 μm, for example between about 3-5 μm. The feature may have a width between about 50-150 nm, for example between about 50-100 nm.

III. Etching/Deposition Processes

Figure 2:
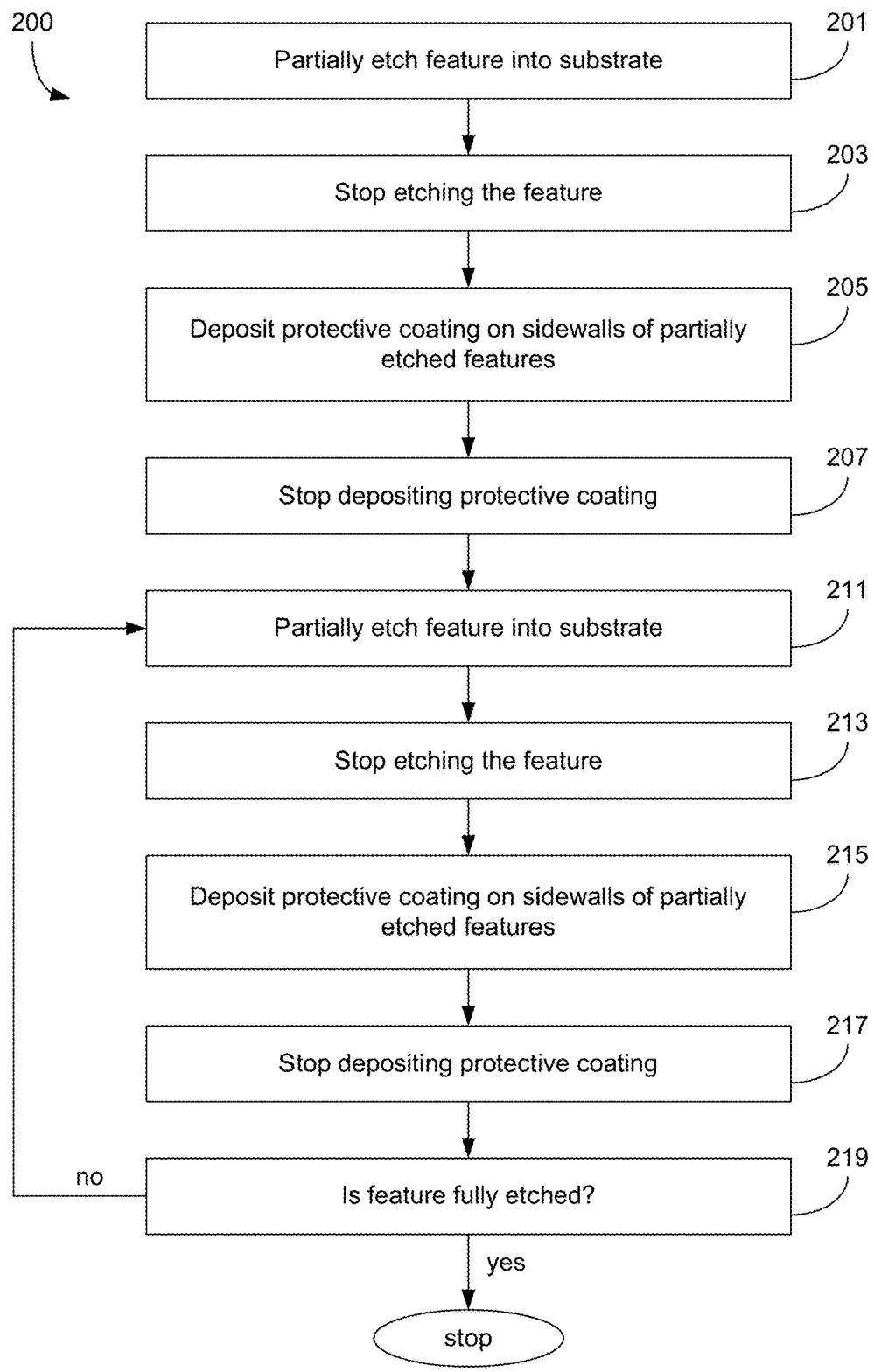
FIG. 2 presents a flowchart for a method of forming an etched feature on a semiconductor substrate according to various disclosed embodiments.

FIG. 2 presents a flowchart for a method 200 of forming an etched feature in a semiconductor substrate. The operations shown in FIG. 2 are described in relation to FIGS. 3A-3D, which show a partially fabricated semiconductor substrate as the feature is etched. A particular embodiment of the method 200 of FIG. 2 is described below in relation to FIGS. 3E-3I. At operation 201, a feature 302 is etched to a first depth in a substrate having material 303 and a patterned mask layer 306. The material 303 may be a single material or a stack of materials. The material 303 often includes one or more layers of dielectric material. The first depth is only a fraction of the final desired depth of the feature. The chemistry used to etch the feature may be a fluorocarbon-based chemistry ($C_xF_y$). Other etch chemistries may be used. This etching operation 201 may result in formation of a first sidewall coating 304. The first sidewall coating 304 may be a polymeric sidewall coating, as described with relation to FIG. 1. The first sidewall coating 304 extends toward the first depth, though in many cases the first sidewall coating 304 does not actually reach the bottom of the feature 302. Notably, in many cases the first sidewall coating 304 does not reach the region of the feature where the bow forms.

The first sidewall coating 304 indirectly forms from the $C_xF_y$ etching chemistry as certain fluorocarbon species/fragments deposit on the sidewalls of the feature (i.e., certain fluorocarbon species are precursors for the first sidewall coating 304). One reason that the first sidewall coating 304 does not reach the bottom of the feature 302 may relate to the sticking coefficient of the precursors that form the coating. In particular, it is believed that for certain etchants the sticking coefficient of these first sidewall coating precursors is too high, which causes the substantial majority of the precursor molecules to attach to the sidewalls soon after entering the feature. As such, few sidewall coating precursor molecules are able to penetrate deeper into the feature where sidewall protection is most beneficial. The first sidewall coating 304 therefore provides only partial protection against over-etching of the sidewalls of the feature 302. In some implementations, the etch conditions provide little if any sidewall protection.

Next, at operation 203 the etching process is stopped. After the etching is stopped, a second sidewall coating 310 is deposited in operation 205. In some cases, the second sidewall coating 310 may be effectively the first sidewall coating. The second sidewall coating 310 is often referred to as the protective film or protective layer. This deposition may occur through various reaction mechanisms including, but not limited to, chemical vapor deposition (CVD) methods and atomic layer deposition (ALD) methods (either of which may be plasma-assisted or thermally driven), molecular layer deposition (MLD) methods, and self-assembled monolayer (SAM) methods. Molecular layer deposition methods are further discussed in U.S. Pat. No. 9,384,998, and self-assembled monolayer deposition methods are further discussed in U.S. patent application Ser. No. 15/225,489, each of which is herein incorporated by reference.

ALD and other adsorption-based methods are particularly well suited for forming films at a desired level of conformality to line or partially line the sidewalls of the features. For instance, certain adsorption-based deposition methods are useful for forming highly conformal films by delivering reactants deep into features due to the adsorption-driven nature of such methods. In conformal films, the deposited film thickness is relatively uniform at all regions of the feature. By contrast, for sub-conformal film deposition, the film is deposited relatively thicker near the top of the feature and relatively thinner (or not at all) near the bottom of the feature. For super-conformal film deposition, the film is deposited relatively thinner near the top of the feature and relatively thicker near the bottom of the feature. Each of these types of depositions may be useful for one or more deposition processes described herein. The conformal, sub-conformal, and super-conformal protective films can be combined as desired for a particular application. Non-adsorption-based deposition techniques (e.g., CVD) may also be used in some cases to form conformal, sub-conformal, and/or superconformal protective films.

As used herein, conformality can be calculated according to Equation 1.

$$\text{Conformality} = \frac{\text{Deposition thickness at neck region}}{\text{Deposition thickness at bow region}} \quad \text{Equation 1}$$

As used herein, a conformal or highly conformal film is a film having a conformality between about 1.0-1.5. A sub-conformal film is a film having a conformality of at least about 1.5. In some cases, a sub-conformal film may have a conformality of at least about 2.5. A super-conformal film is a film having a conformality of about 1.0 or less. These conformalities are calculated according to Equation 1, above.

Figure 3A:
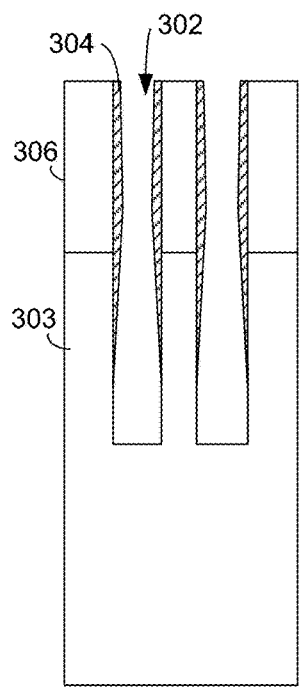
FIGS. 3A-3D depict etched cylinders in a semiconductor substrate as the cylinders are cyclically etched and coated with a protective sidewall coating according to various embodiments.
Figure 3B:
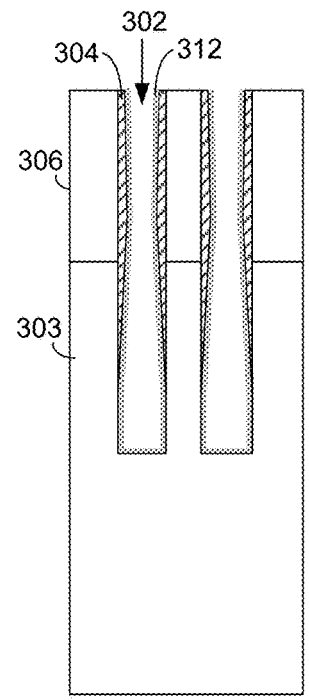
Figure 3C:
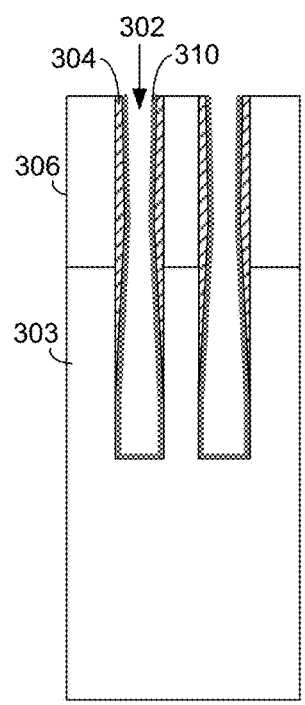

In certain embodiments, the second sidewall coating 310 is deposited (during one or more iterations of deposition operations 205 and/or 215) using a reactant having a relatively low sticking coefficient (e.g., a silicon-containing reactant and/or a boron-containing reactant). The sticking coefficient may be low with respect to whatever species is present on the sidewalls at the time the reactant is delivered (e.g., the sticking coefficient may be low with respect to the native sidewalls and/or any species present on the sidewalls). Further, the relevant sticking coefficient is that of the species that actually contacts the sidewalls; such species may not be the reactant that enters the chamber. In one embodiment where the second sidewall coating 310 is deposited through ALD methods, the deposition in operation 205 and/or operation 215 includes (a) flowing a low sticking coefficient reactant into the reaction chamber and allowing the reactant to adsorb onto the surface of the substrate, thereby forming an adsorbed precursor layer 312; (b) optionally purging the reaction chamber (e.g., by sweeping with a purge gas, evacuating the reaction chamber, or both); (c) exposing the substrate to a plasma generated from an oxygen-containing and/or nitrogen-containing reactant (often provided with hydrogen, as well) to thereby drive a surface reaction to form a layer of the second sidewall coating 310 (this second sidewall coating 310 is typically an etch resistant film); (d) optionally purging the reaction chamber; and (e) repeating (a)-(d) to form additional layers of the second sidewall coating 310. The adsorbed precursor layer 312 is shown in FIG. 3B, and the second sidewall coating 310 is shown in FIG. 3C. The precursor adsorption (FIG. 3B) and film formation (FIG. 3C) may be cycled a number of times to form a film having a desired thickness.

Figure 3D:
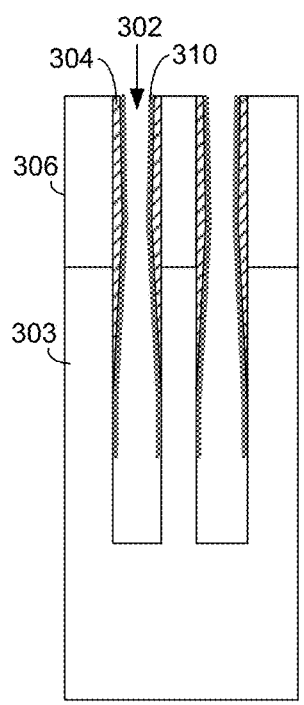

In another embodiment where the second sidewall coating 310 is deposited through CVD methods, the deposition may include flowing a low sticking coefficient reactant into the reaction chamber, optionally with a co-reactant (e.g., an oxygen-containing reactant and/or a nitrogen-containing reactant, optionally provided with hydrogen), while exposing the substrate to plasma. The plasma drives a gas phase reaction that results in deposition of the second sidewall coating 310. In this example, the method is represented by FIGS. 3A, 3C, and 3D (no adsorbed precursor layer 312 is formed, thus FIG. 3B is omitted).

Sticking coefficient is a term used to describe the ratio of the number of adsorbate species (e.g., atoms or molecules) that adsorb/stick to a surface compared to the total number of species that impinge upon that surface during the same period of time. The symbol $S_c$ is sometimes used to refer to the sticking coefficient. The value of $S_c$ is between 0 (meaning that none of the species stick) and 1 (meaning that all of the impinging species stick). Various factors affect the sticking coefficient including the type of impinging species, surface temperature, surface coverage, structural details of the surface, and the kinetic energy of the impinging species. Certain species are inherently more "sticky" than others, making them more likely to adsorb onto a surface each time the specie impinges on the surface. These more sticky species have greater sticking coefficients (all other factors being equal), and are more likely to adsorb near the entrance of a recessed feature compared to less sticky species having lower sticking coefficients. The fluorocarbon species such as those employed in conventional etch processes (and may form the first sidewall coating 304) have relatively high sticking coefficients, and therefore become concentrated near the top of the feature 302 where they first impinge upon the sidewalls. By comparison, species having lower sticking coefficients, even if they impinge upon the surface near the top of the sidewalls, are less likely to adsorb during each impact, and therefore have a greater probability of reaching deeper into the feature 302.

In certain embodiments, silicon-containing reactants and boron-containing reactants are used to form the second sidewall coating 310 and have lower sticking coefficients than the fluorocarbon species that form the first sidewall coating 304. As such, these reactants are suited to forming a protective coating that reaches to the bottom of an etched feature. Further, certain adsorption-based ALD methods are particularly suited for forming a second sidewall coating that reaches the bottom of an etched feature because the reactant can be delivered until it substantially coats the entire sidewalls of the feature. The reactant does not build up near the top of the feature since only a monolayer of reactant typically adsorbs onto the surface during each cycle.

Returning to FIG. 2, the method continues at operation 207 where the deposition process is stopped. The method then repeats the operations of partially etching a feature in the substrate (operation 211, analogous to operation 201), stopping the etch (operation 213, analogous to operation 203), depositing protective coating on sidewalls of the partially etched features (operation 215, analogous to operation 205), and stopping the deposition (operation 217, analogous to operation 207).

The processing conditions used for each operation may be uniform or different between different iterations. For example, the etch conditions for a first etching operation may be different from the etching conditions for a second etching operation. Similarly, the deposition conditions for a first deposition operation may be different from the deposition conditions for a second deposition operation. The changing conditions may accommodate the changing feature shape as the feature is etched more deeply. For instance, the relative position of the bow region within the feature changes as the feature is etched more deeply. By changing the etching and/or deposition conditions as additional etching and/or deposition iterations are performed, the processing conditions for each iteration can be tailored/optimized for the instant feature shape. This allows for protection of the bow region (thereby minimizing the degree to which the bow grows during etching) at any depth in the feature. In one example, explained further in relation to FIGS. 3E-3I, the deposition conditions are different between at least two iterations of deposition operations. In a particular example, the pressure, reactant flow rate, reactant dosing time, RF time, RF power, and/or RF duty cycle may be different between two deposition operations, for example to achieve different levels of conformality of the protective film being deposited in each operation. By tailoring the conformality for each deposition, each protective film can be deposited where it is most useful (e.g., where a bow would otherwise be forming).

Returning to FIG. 2, at operation 219, it is determined whether the feature is fully etched. If the feature is not fully etched, the method repeats from operation 211 with additional etching and deposition of protective coatings. The etching operation 211 may alter the second sidewall coating 310 to form a film that is even more etch resistant than the film deposited in operations 205 and 215. In one example, the deposition operation 205 forms a layer of boron nitride (for example by alternatively cycling $BCl_3$ and $N_2+H_2$ and exposing to plasma), and the etching operation 211 reacts the boron nitride film to form boron oxide (e.g., using chemistry having a combination of fluorocarbon(s) and oxygen). Once the feature is fully etched, the method is complete.

In various embodiments, the etching operation 201 and the protective sidewall coating deposition operation 205 are cyclically repeated a number of times. For instance, these operations may each occur at least twice (as shown in FIG. 2), for example at least about three times, or at least about 5 times. In some cases, the number of cycles (each cycle including etching operation 201 and protective sidewall coating deposition operation 205, with etching operation 211 and deposition operation 215 counting as a second cycle) is between about 2-10, for example between about 2-5. Each time the etching operation occurs, the etch depth increases. The distance etched may be uniform between cycles, or it may be non-uniform. In certain embodiments, the distance etched in each cycle decreases as additional etches are performed (i.e., later performed etching operations may etch less extensively than earlier performed etching operations). The thickness of the second sidewall coating 310 deposited in each deposition operation 205 may be uniform between cycles, or the thickness of such coatings may vary. Example thicknesses for the second sidewall coating 310 during each cycle may range between about 1-10 nm, for example between about 3-5 nm. Similarly, the conformality of the second sidewall coating 310 may be uniform between cycles, or may vary between cycles as explained in relation to FIGS. 3E-3I. Further, the type of coating that is formed may be uniform between the cycles, or it may vary.

The etching operation 201 and the deposition operation 205 may occur in the same reaction chamber or in different reaction chambers. In one example, the etching operation 201 occurs in a first reaction chamber and the deposition operation 205 occurs in a second reaction chamber, with the first and second reaction chambers together forming a multi-chamber processing apparatus such as a cluster tool. Loadlocks and other appropriate vacuum seals may be provided for transferring the substrate between the relevant chambers in certain cases. The substrate may be transferred by a robot arm or other mechanical structure. A reaction chamber used for etching (and in some cases deposition) may be a Flex™ reaction chamber, for example from the 2300® Flex™ product family available from Lam Research Corporation of Fremont, Calif. A reaction chamber used for deposition may be chamber from the Vector® product family or the Altus® product family, both available from Lam Research Corporation. The use of a combined reactor for both etching and deposition may be beneficial in certain embodiments as the need to transfer the substrate is avoided. The use of different reactors for etching and deposition may be beneficial in other embodiments where it is desired that the reactors are particularly optimized for each operation. The relevant reaction chambers are discussed further below.

As noted, the deposition operation helps optimize the etching operation by forming a protective layer at relevant sidewall locations that minimizes or prevents lateral etch of the feature during the etching operation. This promotes formation of etched features having very vertical sidewalls with little or no bowing. In certain implementations, a final etched feature having an aspect ratio of at least about 80 has a bow less than about 60% (measured as the widest critical dimension-narrowest critical dimension above that/narrowest critical dimension below that *100). For example, a feature having a widest CD of 50 nm and a narrowest CD of 40 nm (the 40 nm CD being positioned below the 50 nm CD in the feature) has a bow of 25% (100*(50 nm−40 nm)/40 nm=25%). In another implementation, a final etched feature having an aspect ratio of at least about 40 has a bow less than about 20%.

In certain implementations, the deposition conditions may be tuned for a particular deposition operation. For example, the conditions may be tuned such that a first set of deposition conditions used in a first deposition operation varies from a second set of deposition conditions used in a second deposition operation. The differences in deposition conditions may lead to differences in film thickness, conformality, density, composition, etc. FIGS. 3E-3I illustrate a partially etched substrate at different points during processing in an embodiment where the conformality of the protective film is tuned for different deposition operations. This tuning of conformality allows the protective film to be formed at feature depths where the protective film is most useful (e.g., where a bow would otherwise form).

FIG. 3E illustrates a partially etched substrate that includes a patterned mask layer 306 over material 303. As described above, material 303 may be provided as a single material or as a stack of materials, and may include one or more dielectric materials. A feature 302 is formed in the substrate. In FIGS. 3E-3I, any protective film layer that forms during the etching operation (e.g., the first sidewall coating 304 in FIGS. 3A-3D) is omitted from the figures. Such a layer may or may not form during the etching operation. The asterisk (*) in FIGS. 3E-3I highlights the region of the sidewalls where a bow would otherwise form if no protective film were deposited on the sidewalls. In some embodiments, a bow may actually form in this region, even though a protective film is provided (though the bow is smaller than it would be without the protective film). After the feature 302 is partially etched as shown in FIG. 3E, a first protective film 320a is deposited on sidewalls of the feature 302 as shown in FIG. 3F. In this example, the first protective film 320a is highly conformal, and deposits along substantially the entire length of the sidewalls. The first protective film 320a may or may not form on the bottom surface of the feature, depending on the deposition conditions used and the shape of the feature.

Next, the feature is etched to a deeper depth, as shown in FIG. 3G. The first protective film 320a may be partially, substantially, or wholly etched away during this etching operation. Notably, the first protective film 320a is provided sufficiently deep to reach the area marked by the asterisk (*), where the bow would otherwise form if the first protective film 320a did not cover this region. After etching, a second protective film 320b is deposited, as shown in FIG. 3H. In this example, the second protective film 320b is sub-conformal, meaning that it deposits at a greater thickness on the sidewalls near the opening of the feature 302 and at a lower thickness (or no thickness) on the sidewalls near the bottom of the feature 302. The second protective film 320b is deposited sufficiently deep to cover the region marked by the asterisk (*), where the bow would otherwise form if the second protective film 320b did not cover this region. After formation of the second protective film 320b, the feature 302 is further etched, as shown in FIG. 3I.

Figure 3J:
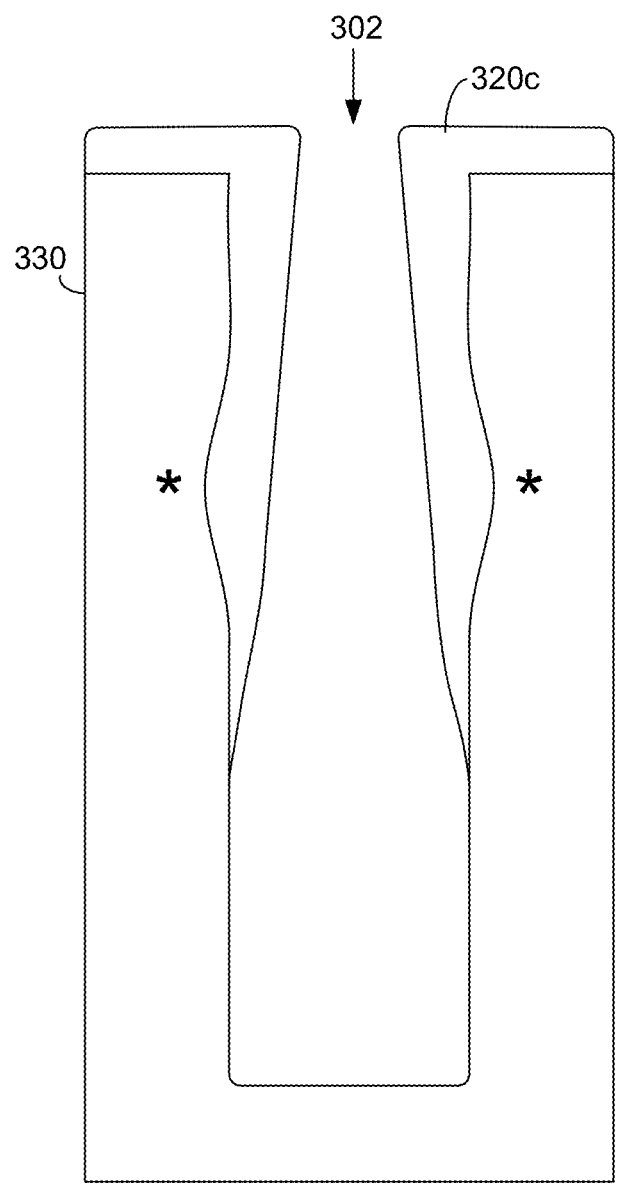
FIG. 3J illustrates an etched cylinder in a semiconductor substrate, where the cylinder includes a bow region and a sub-conformal protective film is formed on the sidewalls of the feature.

FIG. 3J illustrates a partially etched feature 302 formed in substrate 330. In this example, a bow has been etched into the feature during a previous etching operation. The bow is located proximate the asterisk. Protective film 320c is deposited in a sub-conformal manner. Protective film 320c is deposited past the depth of the bow, but not all the way down to the bottom of the feature. In this way, the protective film 320c is targeted where it is most useful. In a subsequent etching operation, protective film 320c will prevent or minimize the degree to which the bow region etches laterally. The protective film 320c acts as a sacrificial material in the later etching operation, ensuring that the sidewalls of the feature are not over-etched in this area. The sub-conformal nature of the protective film 320c also ensures that the bottom of the feature remains open (which permits the use of relatively harsher/faster etching conditions in later etching operations), which may decrease processing times and increase throughput.

In various embodiments, the benefit associated with the protective film is greatest in cases where the reduction in critical dimension at the bow region (as a result of the protective film deposition) is large compared to the reduction in critical dimension proximate the bottom of the feature. In other words, the protective film may be most useful in cases it is deposited in a targeted manner in the region where the bow is forming or would otherwise form (as opposed to regions below where the bow would form). Because the bow is a measure of the difference between the maximum critical dimension of the feature (e.g., at the bow region) vs. the narrowest region below the bow, the protective layer is most beneficial in cases where it protects the bow region without protecting (or without over-protecting) the sidewalls below the bow region. In cases where the protective film is deposited in areas below where the bow would otherwise form (the lower sidewalls), the protective film may protect the lower sidewalls too much, leading to undesirably small critical dimensions proximate the bottom of the feature and constraining a subsequent etching process.

Another advantage of tailoring the conformality of the protective film for different deposition operations is that it allows the etch process to be optimized for opening up/etching the bottom of the feature in a more aggressive manner (e.g., since the bottom sidewalls of the feature may remain uncovered by protective film in regions below where the bow forms or would form). A further benefit associated with tuning the conformality of the protective films deposited in different deposition operations is that the shape of the bottom of the feature may be improved. In various cases, the feature bottoms are more square (and less round) when the conformality of the protective film is tuned/varied for different protective film depositions, as compared to cases where the protective film is always deposited in a highly conformal manner.

Relatedly, the disclosed embodiments result in formation of highly desirable (e.g., highly vertical) feature profiles that show little tapering. Often, in cases where all the protective layers are highly conformal, the resulting feature has a tapered shape due to the bottom portion of the feature being over-protected and insufficiently etched open as a result of the highly conformal protective layer. By contrast, where the protective film is deposited in a targeted manner in the region where the bow forms or would otherwise form, this over-protection of the region below the bow can be avoided and a more vertical profile results. Another advantage related to the disclosed embodiments is that the growth rate of the bow may be minimized. Because the protective film is formed in a targeted manner in the region where the bow forms or otherwise would form, and not much below this region, the bow region is protected to a greater degree than regions below the bow. Because the bow may be measured as a difference between the maximum CD at the bow region and the narrowest CD below the bow region, the targeted protection at the bow region compared to regions below the bow results in slowing the growth of the bow in the feature.

Another advantage associated with the disclosed embodiments is that the risk of capping/clogging the features is reduced. The relatively high reactant flow rates and long reactant dose times associated with more conformal protective film deposition are associated with an increased risk of clogging one or more features during deposition. By using lower reactant flow rates and/or shorter reactant dose times (alone or in combination with other changes in the processing conditions) for at least some of the protective layer depositions, the risk of such clogging is minimized. Further, the use of sub-conformal protective films for at least one of the protective film deposition operations reduces the risk of causing etch stop or slow down. In some cases, a protective film that is deposited in a highly conformal manner over the sidewalls and bottom of a feature may prevent further etching of the feature. This result is undesirable. By depositing the protective layer in a sub-conformal manner in at least some of the deposition operations, this risk is reduced.

A further advantage of the disclosed embodiments is that sub-conformal protective films may enable formation of different mixtures of species within a feature at different depths. Diffusion of neutral species into a recessed feature depends on the reactivity and composition of the surfaces within the feature. By providing a sub-conformal protective film, the sidewall reactivity and composition can be different at different feature depths (e.g., with the protective film provided selectively toward the top sidewalls of the feature compared to the bottom sidewalls of the feature). This may result in a different mixture of neutral species as a function of depth within the feature, which may be beneficial in certain embodiments. The disclosed embodiments have been shown to result in high quality results, even over a relatively wide range of processing temperatures.

In order to target deposition of the protective film in the desired regions, the deposition conditions may be tailored for a particular deposition operation depending on the shape/depth of the feature at that time. For example, with reference to FIGS. 3E-3I, the first protective film 320a is deposited in a highly conformal manner such that it covers substantially the entire depth of the partially etched feature 302. The deposition is tailored to be highly conformal to ensure that the first protective film 320a covers the sidewalls at the region marked by the asterisk (*), where the bow would otherwise form. By contrast, the second protective film 320b is deposited in a sub-conformal manner such that it reaches to a depth that is (a) at least as deep as the region marked by the asterisk (*), where the bow would otherwise form, and (b) not deep enough to reach the bottom of the feature. In many cases, a sub-conformal protective film 320b may be deposited to a depth that is not substantially beyond the depth at which the bow would otherwise form if no protective layer were provided. In some cases, this may mean that the sub-conformal protective film reaches a depth that is no more than about 2 times the depth where the bow would otherwise form (in some cases no more than about 1.5 times). In these or other cases, this may mean that the second protective film reaches a depth that is no more than about 1 $\mu$m, or no more than about 0.5 $\mu$m, below the depth where the bow would otherwise form. In these or other cases, a sub-conformal protective film may reach a depth that is removed from the bottom of the feature by a distance of at least about 0.5 $\mu$m, for example at least about 1 $\mu$m. The desired depth for a given protective film depends on the geometry of the feature at a given time and the conditions used to etch.

While the example shown in FIGS. 3E-3I involves depositing a more conformal protective film before depositing a less conformal protective film, the embodiments are not so limited. In some other embodiments, an earlier deposited protective film may be less conformal than a later deposited protective film. In one implementation, the protective films become less conformal as the feature is further etched into the substrate. In a different implementation, the protective films become more conformal as the feature is further etched into the substrate. In another implementation, a first protective film is deposited in a highly conformal manner, a second protective film is deposited in a sub-conformal manner, and a third protective film is deposited in a highly conformal manner, with the first, second, and third protective films being deposited in that order. Generally speaking, each protective film deposition can be tailored as desired.

Various processing conditions may be varied, singly or together, in order to tailor the conformality (and/or other film characteristic) of the deposited protective film layers. Example processing conditions that may be varied between different protective film depositions include pressure, reactant flow rate, reactant exposure time, RF time, RF power, and/or RF duty cycle. The RF time refers to the duration over which RF energy is provided to generate/maintain a plasma, for cases where the protective film is deposited in a plasma-based process. The RF power refers to the amount of RF power used to drive the plasma. The RF duty cycle refers to the fraction of time that the RF power is actively being applied. The RF power may be provided in a continuous manner or in a pulsed manner.

It is believed that higher reaction chamber pressure generally leads to more conformal films. Similarly, it is believed that higher reactant flow rates and longer reactant exposure times lead to more conformal films. These factors may affect how deeply the reactant(s) are able to penetrate into the partially etched features, thereby controlling how deeply the protective film forms. It is also believed that longer RF times and/or higher RF powers and/or higher RF duty cycles lead to more conformal films, for example due to more complete conversion of the reactants. Each of these variables may be effective, within a certain range, for tuning conformality.

For cyclic deposition processes, the relevant processing variables reported herein relate to those used during a single deposition cycle. For instance, where the protective layer forms through a plasma assisted atomic layer deposition, the RF exposure time and the reactant delivery time each correspond to the duration of such operations during a single plasma assisted ALD cycle (rather than the cumulative duration during all ALD cycles).

In one example, a first protective film is deposited in a first deposition operation using a first set of deposition conditions, and a second protective film is deposited in a second deposition operation using a second set of deposition conditions, at least one deposition parameter is different between the first and second set of deposition conditions, the deposition parameter being selected from the group consisting of: reaction chamber pressure, reactant flow rate, reactant dose time, RF time, and RF power. The second protective film may be deposited at a lower pressure than the first protective film. The second protective film may be deposited at a lower reactant flow rate than the first protective film. The second protective film may be deposited at a shorter reactant dose time than the first protective film. The second protective film may be deposited at a shorter RF time than the first protective film. The second protective film may be deposited at a lower RF power than the first protective film. The second protective film may be deposited at a lower duty cycle than the first protective film. In a particular example, the first protective film is formed with a continuous plasma and the second protective film is formed with a pulsed plasma. The second protective film may be deposited after the first protective film. In other cases, the second protective film may be deposited before the first protective film. Of course, the methods herein can be used to deposit any number of protective films using any number of different sets of deposition conditions.

IV. Materials and Parameters of the Process Operations

A. Substrate

The methods disclosed herein are particularly useful for etching semiconductor substrates having dielectric materials thereon. Example dielectric materials include silicon oxides, silicon nitrides, silicon carbides, oxynitrides, oxycarbides, carbo-nitrides, doped versions of these materials (e.g., doped with boron, phosphorus, etc.), and laminates from any combinations of these materials. Particular example materials include stoichiometric and non-stoichiometric formulations of $SiO_2$, SiN, SiON, SiOC, SiCN, etc. As noted above, the dielectric material that is etched may include more than one type/layer of material. In particular cases, the dielectric material may be provided in alternating layers of SiN and $SiO_2$ or alternating layers of polysilicon and $SiO_2$. Further details are provided above. The substrate may have an overlying mask layer that defines where the features are to be etched. In certain cases, the mask layer is Si, and it may have a thickness between about 500-1500 nm.

B. Etching Process

In various embodiments, the etching process is a reactive ion etch process that involves flowing a chemical etchant into a reaction chamber (often through a showerhead), generating a plasma from, inter alia, the etchant, and exposing a substrate to the plasma. The plasma dissociates the etchant compound(s) into neutral species and ion species (e.g., charged or neutral materials such as CF, $CF_2$ and $CF_3$). The plasma is a capacitively coupled plasma in many cases, though other types of plasma may be used as appropriate.

Ions in the plasma are directed toward the wafer and cause the dielectric material to be etched away upon impact.

Example apparatus that may be used to perform the etching process include the 2300® FLEX™ product family of reactive ion etch reactors available from Lam Research Corporation of Fremont, Calif. This type of etch reactor is further described in the following U.S. patents, each of which is herein incorporated by reference in its entirety: U.S. Pat. No. 8,552,334, and U.S. Pat. No. 6,841,943.

Various reactant options are available to etch the features into the dielectric material. In certain cases, the etching chemistry includes one or more fluorocarbons. In these or other cases, the etching chemistry may include other etchants such as $NF_3$. One or more co-reactants may also be provided. In some cases oxygen ($O_2$) is provided as a co-reactant. The oxygen may help moderate formation of a protective polymer sidewall coating (e.g., the first sidewall coating 304 of FIGS. 3A-3D).

In certain implementations, the etching chemistry includes a combination of fluorocarbons and oxygen. For instance, in one example the etching chemistry includes $C_4F_6$, $C_4F_8$, $N_2$, CO, $CF_4$, and $O_2$. Other conventional etching chemistries may also be used, as may non-conventional chemistries. The fluorocarbons may flow at a rate between about 0-500 sccm, for example between about 10-200 sccm. Where $C_4F_6$ and $C_4F_8$ are used, the flow of $C_4F_6$ may range between about 10-200 sccm and the flow of $C_4F_8$ may range between about 10-200 sccm. The flow of oxygen may range between about 0-500 sccm, for example between about 10-200 sccm. The flow of nitrogen may range between about 0-500 sccm, for example between about 10-200 sccm. The flow of tetrafluoromethane may range between about 0-500 sccm, for example between about 10-200 sccm. The flow of carbon monoxide may range between about 0-500 sccm, for example between about 10-200 sccm These rates are appropriate in a reactor volume of approximately 50 liters.

In some embodiments, the substrate temperature during etching is between about 30-200° C. In some embodiments, the pressure during etching is between about 5-80 mTorr. The ion energy may be relatively high, for example between about 1-10 kV. The ion energy is determined by the applied RF power. In various cases, dual-frequency RF power is used to generate the plasma. Thus, the RF power may include a first frequency component (e.g., about 2 MHz) and a second frequency component (e.g., about 60 MHz). Different powers may be provided at each frequency component. For instance, the first frequency component (e.g., about 2 MHz) may be provided at a power between about 3-24 kW, for example about 10 kW, and the second frequency component (e.g., about 60 MHz) may be provided at a lower power, for example between about 0.5-10 kW, for example about 2 kW. In some embodiments, three different frequencies of RF power are used to generate the plasma. For example, the combination could be 2 MHz, 27 MHz, and 60 MHz. Power levels for the third frequency component (e.g. about 27 MHz) may be similar to those powers specified above for the second frequency component. These power levels assume that the RF power is delivered to a single 300 mm wafer. The power levels can be scaled linearly based on substrate area for additional substrates and/or substrates of other sizes (thereby maintaining a uniform power density delivered to the substrate). In some embodiments, the applied RF power during etching may be modulated between a higher power and a lower power at a repetition rate between about 100-40,000 Hz.

Each cycle of the etching process etches the dielectric material to some degree. The distance etched during each cycle may be between about 10-500 nm, for example between about 50-200 nm. The total etch depth will depend on the particular application. For some cases (e.g., DRAM) the total etch depth may be between about 1.5-2 μm. For other cases (e.g., 3D NAND) the total etch depth may be at least about 3 μm, for example at least about 4 μm. In these or other cases, the total etch depth may be about 5 μm or less.

As explained in the discussion of FIGS. 3A-3D, the etching process can produce a first sidewall coating (e.g., first sidewall coating 304, which may be polymeric). However, the depth of this sidewall coating may limited to the area near the upper portion of the feature, and may not extend all the way down into the feature where the sidewall protection is also needed. Thus, a separate deposition operation is performed, as described herein, to form a sidewall coating that covers substantially the entire depth of the etched feature.

In some processes, the operation of depositing the protective sidewall coating (e.g., the second sidewall coating 310 in FIGS. 3C and 3D) results in the deposition of a first type of film, and the etching operation alters this first type of film to form a second type of film. The second type of film may be more etch resistant than the first type of film. For instance, the deposition operation may involve formation of a boron nitride (BN) film, which is then processed into a boron oxide (BO) film during the etch operation. The inclusion of oxygen in the etch chemistry may at least partially drive this change. The boron oxide film may be particularly resistant to etching, thereby providing very good protection against over-etching the sidewalls.

C. Deposition Process

The deposition process is performed primarily to deposit a protective layer on the sidewalls within the etched features. The deposition process may be tuned for a particular deposition operation based on, e.g., the shape of the feature at the time that a relevant protective layer is deposited. Because the feature shape changes as the feature is etched more fully, the deposition conditions may be changed to accommodate the changing feature shape. Further, certain properties of the protective layer may change for different deposition operations. In one example, the conformality of the protective layer may be varied over the course of fully etching the feature (e.g., with an earlier deposited protective layer being formed at a different conformality than a later deposited protective layer). In another example, the thickness, density, and/or composition of the protective layer may change over the course of fully etching the feature (e.g., with an earlier deposited protective layer having different thickness, density, or composition compared to later a deposited protective layer).

In some cases, it is beneficial for a protective layer to extend deep into the feature. Formation of the protective layer deep within high aspect ratio features may be enabled by reactants that have relatively low sticking coefficients. Further, reaction mechanisms that rely on adsorption-based deposition (e.g., ALD reactions, MLD reactions, and SAM reactions) can promote formation of the protective layer deep within the etched features, particularly at relatively high pressures, high reactant flow rates, long reactant dose times, long RF times, high RF powers, and high RF duty cycles. In these or other cases, it may be beneficial for a protective layer to be deposited in a sub-conformal manner, meaning that it is deposited relatively thicker near the tops of the sidewalls, and relatively thinner (or not at all) near the bottom of the sidewalls. Highly conformal and sub-conformal protective layer depositions may be combined in a single embodiment in some cases, for example as described in relation to FIGS. 3E-3I.

Deposition of the protective layer begins after the feature is partially etched. As noted in the discussion of FIG. 2, the deposition operation may be cycled with the etching operation to form additional sidewall protection as the feature is etched deeper into the dielectric material. In some cases, deposition of the protective layer begins at or after the feature is etched to at least about ⅓ of its final depth. In some embodiments, deposition of the protective layer begins once the feature reaches an aspect ratio of at least about 2, at least about 5, at least about 10, at least about 15, at least about 20, or at least about 30. In these or other cases, the deposition may begin before the feature reaches an aspect ratio of about 4, about 10, about 15, about 20, about 30, about 40, or about 50. In some embodiments, deposition begins after the feature is at least about 1 µm deep, or at least about 1.5 µm deep (e.g., in 3D NAND embodiments where the final feature depth is 3-4 µm). In other embodiments, deposition begins after the feature is at least about 600 nm deep, or at least about 800 nm deep (e.g., in DRAM embodiments where the final feature depth is 1.5-2 µm deep). The optimal time for initiating deposition of the protective layer is immediately before the sidewalls would otherwise become overetched to form a bow. The exact timing of this occurrence depends on the shape of the feature being etched, the material being etched, the chemistry used to etch and to deposit the protective layer, and the process conditions used to etch and deposit the relevant materials.

The protective layer that forms during the deposition process may have various compositions. As explained, a protective layer may or may not penetrate deep into an etched feature, and is often relatively resistant to the etching chemistry used to etch the feature. In some cases the protective layer (or one of the protective layers) is a ceramic material or an organic polymer. Organic, non-polymeric films may also be used. Example inorganic materials may include, but are not limited to, boron-containing materials such as stoichiometric or non-stoichiometric formulations of boron oxides ($B_xO_y$) and boron nitrides ($B_xN_y$). Other examples include stoichiometric or non-stoichiometric formulations of silicon-containing materials such as silicon oxides ($Si_xO_y$), silicon nitrides ($Si_xN_y$), silicon carbides ($Si_xC_y$), silicon oxynitrides ($Si_xO_yN_z$), silicon oxycarbides ($Si_xO_yC_z$), silicon oxysulfides ($Si_xO_yS_z$). Other examples include stoichiometric or non-stoichiometric formulations of metal-containing materials such as metal oxides, metal nitrides, metal carbides, and combinations thereof. Other examples include carbon-polymer films.

Example organic materials may include polyolefins, for example polyfluoroolefins in some cases. One particular example is a polytetrafluoroethylene. A precursor fragment used for forming some polyfluoroolefins is $CF_2$ (which may come from hexafluoropropylene oxide (HFPO) in certain cases), which has a very low sticking coefficient and is therefore good at penetrating deep into an etched feature. Other examples may include stoichiometric and non-stoichiometric formulations of boron carbides or silicon carbides. In further embodiments, the protective layer that forms during the deposition process may be a metal oxide, metal nitride, or metal carbide.

In certain embodiments, the protective layer that forms during the deposition process is an organic polymer. In some cases the organic polymer is a polyamide or polyester. In a particular case a polyamide protective layer is formed from a combination of an acyl chloride and a diamine. In some other cases a polyamide protective layer may be formed from a combination of an acid anhydride and a diamine. In certain other embodiments a polyester protective layer may be formed from a combination of an acyl chloride and a diol. In some embodiments a polyester protective layer may be formed from a combination of an acid anhydride with a diol. In some implementations, a protective layer may be a metal-containing polymer formed from a combination of an organic metal precursor and a diamine. In some other implementations, a protective layer may be a metal-containing polymer formed from a combination of an organic metal precursor and a diol. Example acid anhydrides include, but are not limited to, maleic anhydride. Example metal organic precursors include, but are not limited to, trimethylaluminum. In some particular examples the protective layer is a polyamide layer formed from a combination of malonyl dichloride and ethylenediamine. Such reactants may be used in an MLD process to form the protective layer in various embodiments Where the protective layer includes boron, a boron-containing reactant may be used. Example boron-containing reactants include, but are not limited to, triisopropyl borate ($[(CH_3)_2CHO]_3B$), trimethylboron-$d_9$ ($B(CD_3)_3$), triphenylborane (($C_6H_5)_3B$), and tris(pentafluorophenyl)borane (($C_6F_5)_3B$). Other examples of boron-containing reactants include boron trichloride ($BCl_3$), borane ($BH_3$), diborane ($B_2H_6$), boron trifluoride ($BF_3$), and trimethyl borate ($B(OCH_3)_3$). In a particular example, a boron-containing reactant is selected from the group consisting of: $B_2H_6$, $BCl_3$, $BF_3$, and combinations thereof. Cyclic ALD or ALD-like deposition reactions may deposit the boron-containing protective layer. Alternatively, non-cyclic processes such as bulk CVD deposition may deposit the boron-containing protective layer.

Where the protective layer includes silicon, a silicon-containing reactant may be used. A silicon-containing reactant may be, for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. One specific bromosilane is $SiBr_4$. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)_3$). In a particular example, a silicon-containing reactant is selected from the group consisting of $SiCl_4$, $SiH_4$, $SiF_4$, $SiBr_4$, and combinations thereof. Cyclic ALD or ALD-like deposition reactions may deposit the silicon-containing protective layer. Alternatively, non-cyclic processes such as bulk CVD deposition may deposit the silicon-containing protective layer. In certain embodiments, the silicon containing precursor is reacted with an oxidant such nitrous oxide and/or molecular oxygen to produce a silicon oxide protective coating.

Where the protective film includes nitrogen—e.g., a silicon nitride, a silicon oxynitride, or a boron nitride—a nitrogen-containing reactant may be used. A nitrogen-containing reactant contains at least one nitrogen, for example, nitrogen, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants. Another example is nitrous oxide.

Where the protective film includes oxygen—e.g., a silicon oxide, a boron oxide, or a metal oxide—an oxygen-containing reactant may be used. Examples of oxygen-containing reactants include, but are not limited to, oxygen, ozone, nitrous oxide, nitric oxide, nitrogen dioxide, carbon monoxide, carbon dioxide, sulfur oxide, sulfur dioxide, oxygen-containing hydrocarbons ($C_xH_yO_z$), water, mixtures thereof, etc. The disclosed precursors are not intended to be limiting.

When the protective coating contains an organic polymer, a low sticking coefficient precursor is used. Examples of such precursors include those that produce $CF_2$ fragments.

Other reactants may also be used as known by those of ordinary skill in the art. For example where the protective film includes a metal (e.g., a metal oxide, metal nitride, metal carbide, etc.), a metal-containing reactant may be used. Example metals include, but are not limited to, tungsten, titanium, tantalum, ruthenium, aluminum, iron, and hafnium.

Example aluminum-containing reactants include, but are not limited to, aluminum tris(2,2,6,6-tetramethyl-3,5-heptanedionate), triisobutylaluminum, trimethyl aluminum, and tris(dimethylamido)aluminum(III), etc.

Example tungsten-containing reactants include, but are not limited to, bis(butylcyclopentadienyl)tungsten(IV) diiodide, bis(tert-butylimino)bis(tert-butylamino)tungsten, bis(tert-butylimino)bis(dimethylamino)tungsten(VI), bis(cyclopentadienyl)tungsten(IV) dichloride, bis(cyclopentadienyl)tungsten(IV) dihydride, bis(isopropylcyclopentadienyl)tungsten(IV) dihydride, cyclopentadienyltungsten(II) tricarbonyl hydride, tetracarbonyl(1,5-cyclooctadiene)tungsten(0), triamminetungsten(IV) tricarbonyl, tungsten hexacarbonyl, etc.

Example titanium-containing reactants include, but are not limited to, bis(tert-butylcyclopentadienyl)titanium(IV) dichloride, tetrakis(diethylamido)titanium(IV), tetrakis(dimethylamido)titanium(IV), tetrakis(ethylmethylamido)titanium(IV), titanium(IV) diisopropoxidebis(2,2,6,6-tetramethyl-3,5-heptanedionate), titanium(IV) isopropoxide, titanium tetrachloride, etc.

Example tantalum-containing reactants include, but are not limited to, pentakis(dimethylamino)tantalum(V), tantalum(V) ethoxide, tris(diethylamido)(tert-butylimido)tantalum(V), tris(ethylmethylamido)(tert-butylimido)tantalum(V), etc.

Example ruthenium-containing reactants include, but are not limited to, bis(cyclopentadienyl)ruthenium(II), bis(ethylcyclopentadienyl)ruthenium(II), bis(pentamethylcyclopentadienyl)ruthenium(II), triruthenium dodecacarbonyl, etc.

Example iron-containing reactants include, but are not limited to, [1,1'-bis(diphenylphosphino)ferrocene]tetracarbonylmolybdenum(0), bis(pentamethylcyclopentadienyl)iron(II), 1,1'-diethylferrocene, iron(0) pentacarbonyl, iron(III) tris(2,2,6,6-tetramethyl-3,5-heptanedionate), etc.

Example hafnium-containing reactants include, but are not limited to, bis(tert-butylcyclopentadienyl)dimethylhafnium(IV), bis(methyl-η5-cyclopentadienyl)dimethylhafnium, bis(methyl-η5-cyclopentadienyl)methoxymethylhafnium, bis(trimethyl silyl)amidohafnium(IV) chloride, dimethylbis(cyclopentadienyl)hafnium(IV), hafnium(IV) tert-butoxide, hafnium isopropoxide isopropanol, tetrakis(diethylamido)hafnium(IV), tetrakis(dimethylamido)hafnium(IV), tetrakis(ethylmethylamido)hafnium(IV), etc.

Similarly, where the protective film includes carbon, a carbon-containing reactant may be used.

A few particular examples of reactant combinations will be provided, though these examples are not intended to be limiting. In one example, a boron-containing precursor film is formed by adsorbing a boron-containing reactant such as $B_2H_6$, $BCl_3$ or $BF_3$ to the substrate surface. The precursor film is converted to a protective film through exposure to an oxidizing or nitridizing plasma (e.g., the plasma being generated from $O_2$, $N_2$, $NH_3$, $N_2O$, $H_2$, and combinations thereof).

In a particular example, $BCl_3$ is adsorbed to form the boron-containing precursor layer, and then a plasma is generated from a combination of $N_2$ and $H_2$, which drives formation of a boron nitride protective film. The reaction may occur through a cyclic process such as ALD. In a similar example, the reaction may occur through a continuous process such as CVD, where the $BCl_3$, $N_2$ and $H_2$ are all provided concurrently while the substrate is exposed to plasma. After formation of the boron nitride film, the substrate may be further etched. The etching chemistry may include oxygen (along with other etching chemistry, e.g., fluorocarbons such as $C_4F_6$ and/or $C_4F_8$), which can react with the boron nitride film to form boron oxide. The boron oxide is particularly resistant to the fluorocarbon-based etch chemistry, thereby providing good protection against over-etching the sidewalls.

In another example, a silicon containing species (e.g., $SiCl_4$, $SiH_4$, $SiF_4$, $SiBr_4$, etc.) is adsorbed onto the surface of the substrate to form a silicon-containing precursor film. The silicon-containing precursor film may be converted to silicon oxide or silicon nitride by exposing it to a plasma generated from $O_2$, $N_2$, $NH_3$, $N_2O$, $H_2$, and combinations thereof. If the dielectric material being etched includes silicon oxide, it may be preferable to form the protective layer as a silicon nitride (and vice versa).

As noted above, the precursor(s) used to form one or more of the protective layers may have relatively low sticking coefficients, thereby enabling the precursors to penetrate deep into the etched features to form a highly conformal protective film. In some cases, the sticking coefficient of the precursors (at the relevant deposition conditions) may be about 0.05 or less, for example about 0.001 or less during formation of at least one of the protective layers. Higher sticking coefficient precursor(s) may be used in cases where it is desired to form sub-conformal protective films.

The reaction mechanism may be cyclic (e.g., ALD) or continuous (e.g., CVD). Any method that results in the formation of the protective sidewall film at desired sidewall locations may be used. As mentioned, ALD, MLD, and SAM reactions may be particularly well suited for this purpose due to their tunable conformality and self-limited properties. Plasma assisted atomic layer deposition may be especially well suited for tunable conformality. However, other types reactions may be used so long as the film is able to form at desired locations to protect the sidewalls in an etched feature (especially at regions where a bow forms or would otherwise form if no protective film were provided). The basic operations for ALD and CVD reactions are described above in relation to operation 205 of FIG. 2. Briefly, plasma assisted ALD reactions involve cyclically performing the following operations: (a) delivery of a first reactant to form an adsorbed precursor layer, (b) an optional purge operation to remove the first reactant from the reaction chamber, (c) delivery of a second reactant, often provided in the form of a plasma, (d) optional purge to remove excess reactant, and (e) repeating (a)-(d) until the film reaches a desired thickness. Because the reactants are provided at separate times and the reaction is a surface reaction, the film is adsorption limited. This results in the formation of very conformal films that can line entire recessed features. By contrast, plasma assisted CVD reactions involve delivering reactant(s) to the substrate continuously while the substrate is exposed to plasma. CVD reactions are gas phase reactions, which deposit reaction products on the substrate surface. As mentioned above, MLD and SAM reactions are further described in certain patents or patent applications that are incorporated herein by reference. Briefly, MLD reactions deposit thin films of organic polymer using ALD-like cycles involving two half-reactions. SAM reactions deposit adsorption-limited thin films of organic material using a single precursor having a head group and a tail group.

The following reaction conditions may be used in certain embodiments where the deposition reaction for forming at least one layer of protective film occurs through ALD methods. The substrate temperature may be maintained between about 0-500° C., for example between about 20-200° C. The pressure may be maintained as low as about 100 or 200 mTorr and as high as about 1, 2, or 3 Torr. The ion energy may be relatively low, for example below about 1 kV. The RF frequency used to generate the plasma may be about 60 MHz, though other frequencies may also be used. The RF power may be a few hundred Watts, for example about 500 W or less, about 400 W or less, or about 300 W or less (assuming the power is delivered to a single 300 mm wafer, the power scaling linearly based on substrate area for additional or differently sized substrates). During each ALD cycle, the adsorbing reactant may be delivered for a duration between about 0.5-20 seconds, at a flow rate between about 50-1000 sccm. The first purge may have a duration between about 0-60 seconds. The plasma may be exposed to the substrate for a duration between about 0.5-120 seconds, with a flow rate of a reactant (excluding any inert gas provided along with the reactant) between about 50-1000 sccm. A flow rate of hydrogen during the plasma exposure may be between about 0-1000 sccm. The post-RF purge may have a duration between about 0-60 seconds.

The following reaction conditions may be used in certain embodiments where the deposition reaction for forming at least one layer of protective film occurs through CVD methods. The substrate temperature may be maintained between about 0-500° C., for example between about 20-200° C. The pressure may be maintained between about 100-3000 mT. The RF frequency used to generate the plasma may be 2-60 MHz. The RF power used to generate the plasma may be between about 50-2000 W, for example between about 100-800 W (assuming a single 300 mm substrate). The duration of the reactant delivery and plasma exposure may be between about 1-180 seconds. The flow rates depend on the particular reactants. In one example, $BCl_3$, $N_2$ and $H_2$ are provided, with $BCl_3$ provided at a flow rate between about 50-1000 sccm, $N_2$ at a rate between about 50-1000 sccm, and $H_2$ at a rate between about 50-1000 sccm. The ALD and CVD reaction conditions are provided as guidance and are not intended to be limiting.

V. Apparatus

The methods described herein may be performed by any suitable apparatus or combination of apparatus. A suitable apparatus includes hardware for accomplishing the process operations and a system controller having instructions for controlling process operations in accordance with the present invention. For example, in some embodiments, the hardware may include one or more process stations included in a process tool. One process station may be an etching station and another process station may be a deposition station. In another embodiment, etching and deposition occur in a single station/chamber.

Figure 4A:
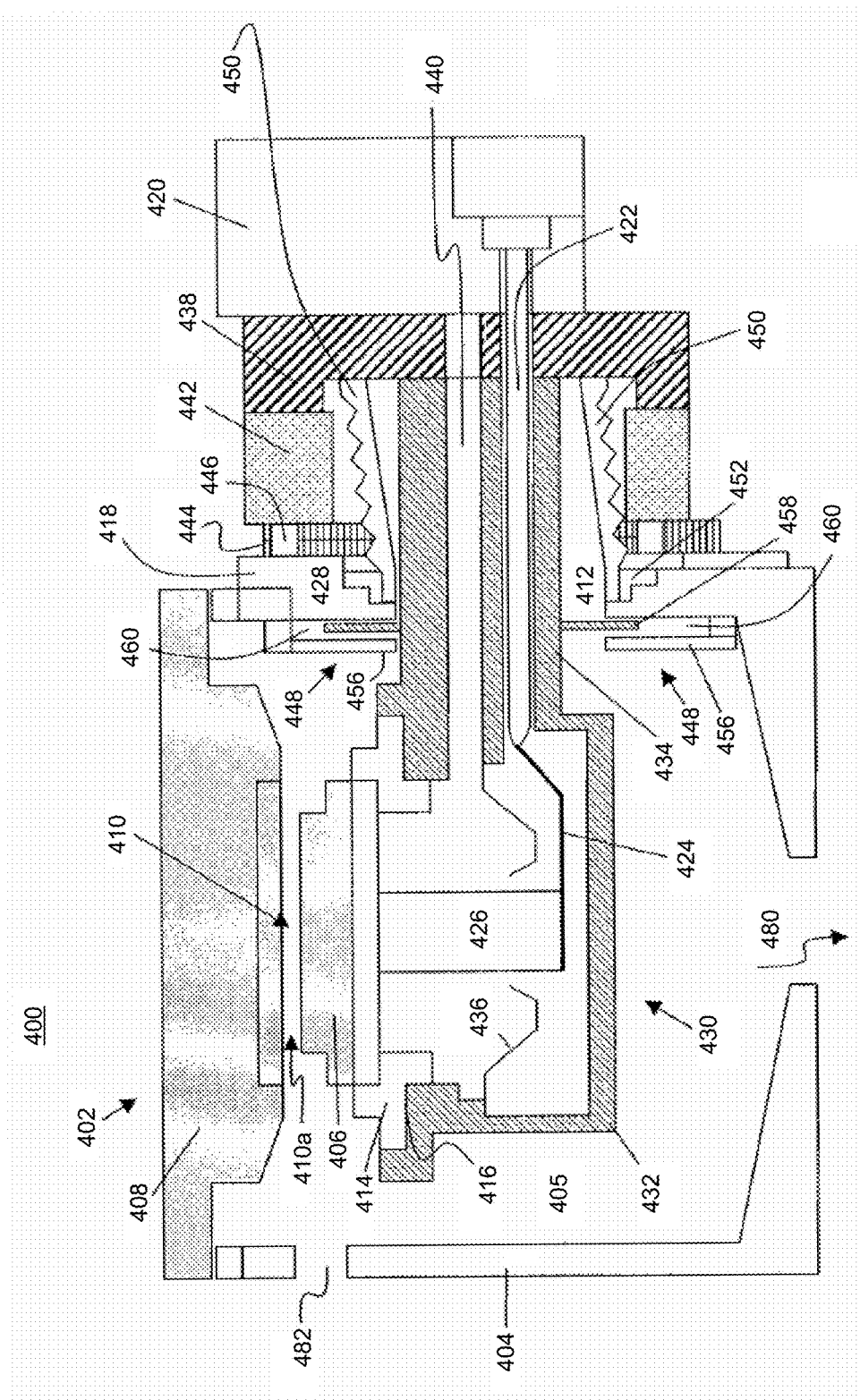
FIGS. 4A-4C illustrate a reaction chamber that may be used to perform the etching processes described herein according to certain embodiments.
Figure 4B:
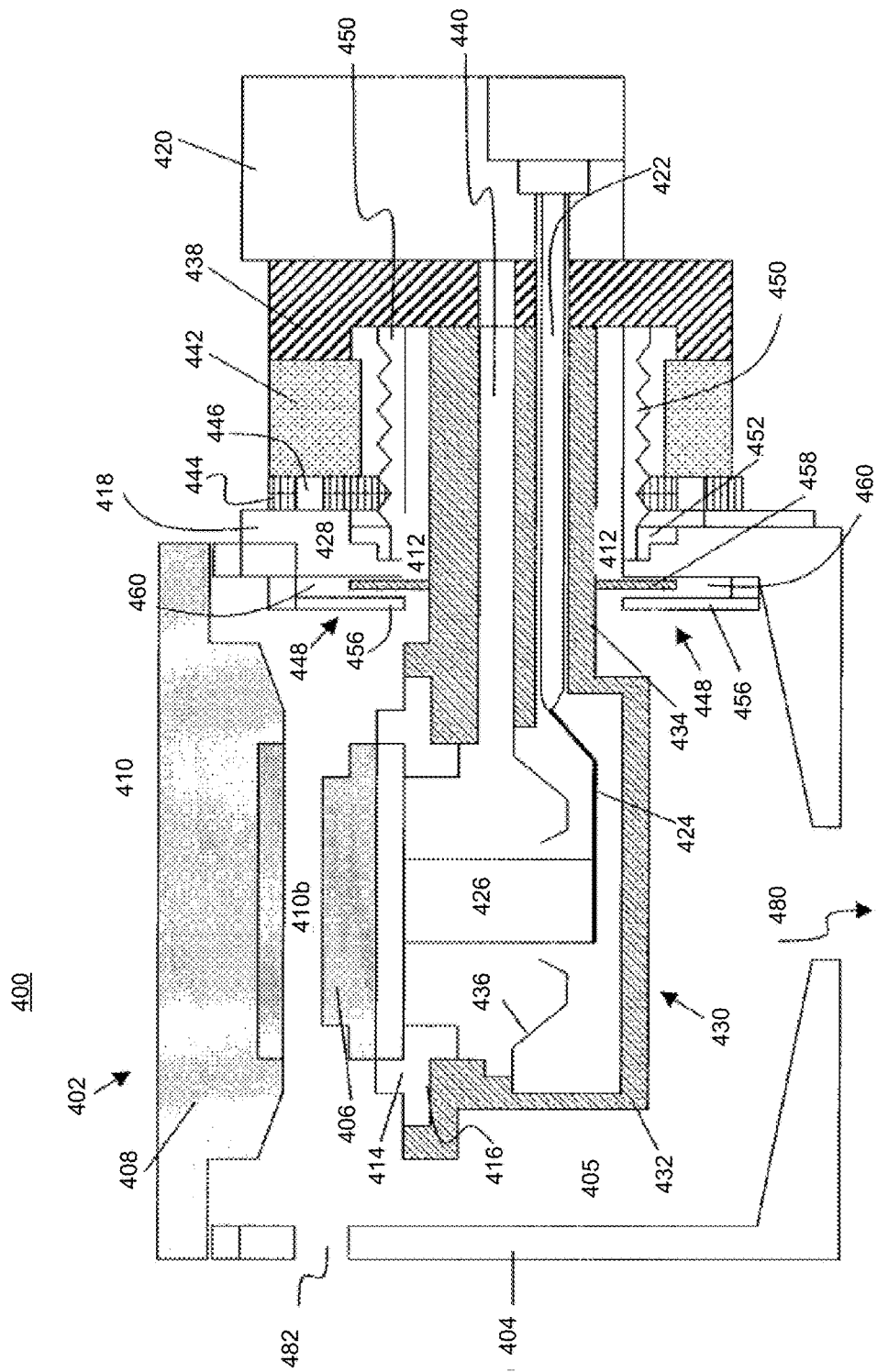
Figure 4C:
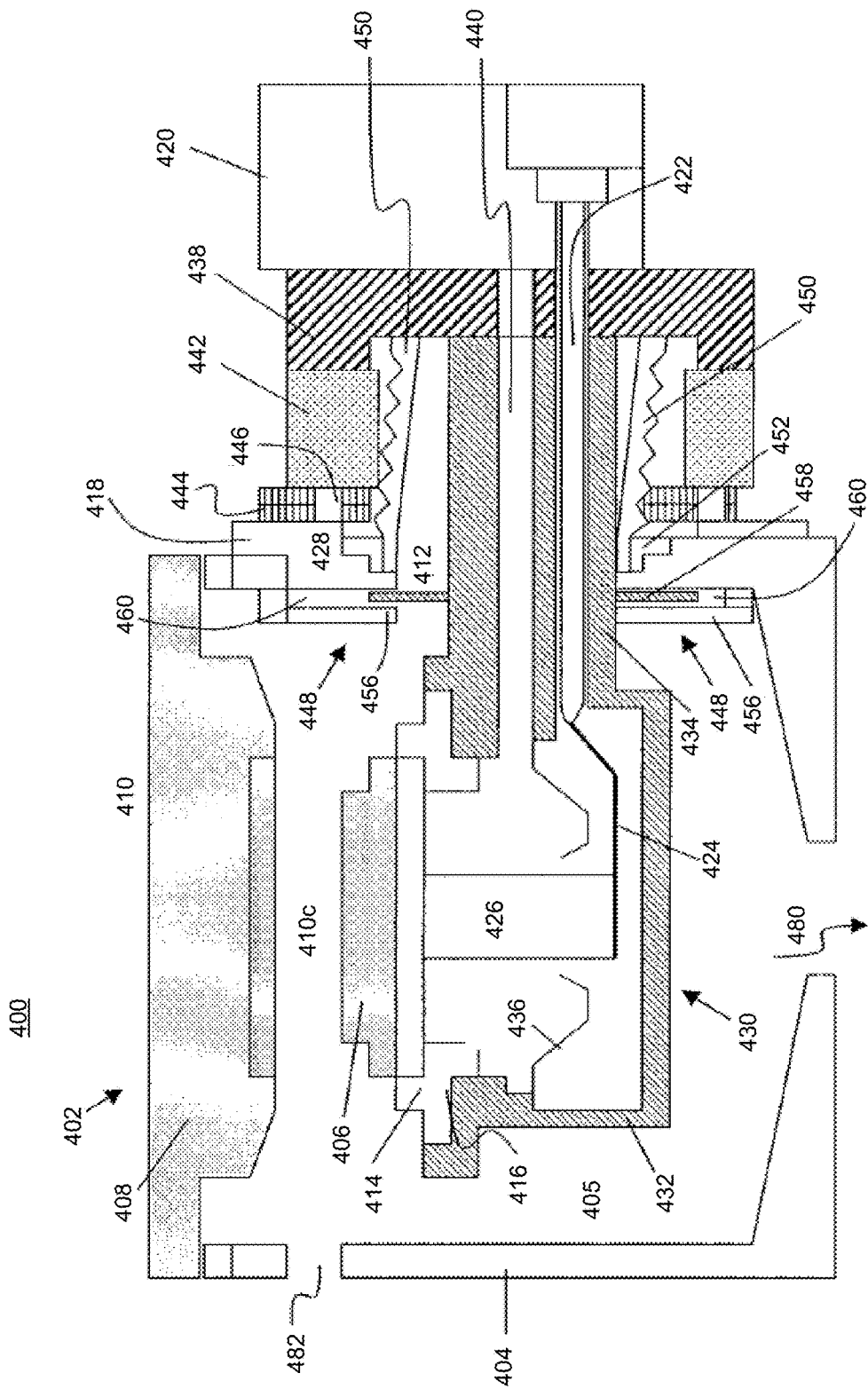

FIGS. 4A-4C illustrate an embodiment of an adjustable gap capacitively coupled confined RF plasma reactor 400 that may be used for performing the etching operations described herein. As depicted, a vacuum chamber 402 includes a chamber housing 404, surrounding an interior space housing a lower electrode 406. In an upper portion of the chamber 402 an upper electrode 408 is vertically spaced apart from the lower electrode 406. Planar surfaces of the upper and lower electrodes 408, 406 are substantially parallel and orthogonal to the vertical direction between the electrodes. Preferably the upper and lower electrodes 408, 406 are circular and coaxial with respect to a vertical axis. A lower surface of the upper electrode 408 faces an upper surface of the lower electrode 406. The spaced apart facing electrode surfaces define an adjustable gap 410 therebetween. During operation, the lower electrode 406 is supplied RF power by an RF power supply (match) 420. RF power is supplied to the lower electrode 406 though an RF supply conduit 422, an RF strap 424 and an RF power member 426. A grounding shield 436 may surround the RF power member 426 to provide a more uniform RF field to the lower electrode 406. As described in commonly-owned U.S. Pat. No. 7,732,728, the entire contents of which are herein incorporated by reference, a wafer is inserted through wafer port 482 and supported in the gap 410 on the lower electrode 406 for processing, a process gas is supplied to the gap 410 and excited into plasma state by the RF power. The upper electrode 408 can be powered or grounded.

In the embodiment shown in FIGS. 4A-4C, the lower electrode 406 is supported on a lower electrode support plate 416. An insulator ring 414 interposed between the lower electrode 406 and the lower electrode Support plate 416 insulates the lower electrode 406 from the support plate 416.

An RF bias housing 430 supports the lower electrode 406 on an RF bias housing bowl 432. The bowl 432 is connected through an opening in a chamber wall plate 418 to a conduit support plate 438 by an arm 434 of the RF bias housing 430. In a preferred embodiment, the RF bias housing bowl 432 and RF bias housing arm 434 are integrally formed as one component, however, the arm 434 and bowl 432 can also be two separate components bolted or joined together.

The RF bias housing arm 434 includes one or more hollow passages for passing RF power and facilities, such as gas coolant, liquid coolant, RF energy, cables for lift pin control, electrical monitoring and actuating signals from outside the vacuum chamber 402 to inside the vacuum chamber 402 at a space on the backside of the lower electrode 406. The RF supply conduit 422 is insulated from the RF bias housing arm 434, the RF bias housing arm 434 providing a return path for RF power to the RF power supply 420. A facilities conduit 440 provides a passageway for facility components. Further details of the facility components are described in U.S. Pat. Nos. 5,948,704 and 7,732,728 and are not shown here for simplicity of description. The gap 410 is preferably surrounded by a confinement ring assembly or shroud (not shown), details of which can be found in commonly owned published U.S. Pat. No. 7,740,736 herein incorporated by reference. The interior of the vacuum chamber 402 is maintained at a low pressure by connection to a vacuum pump through vacuum portal 480.

The conduit support plate 438 is attached to an actuation mechanism 442. Details of an actuation mechanism are described in commonly-owned U.S. Pat. No. 7,732,728 incorporated herein by above. The actuation mechanism 442, such as a servo mechanical motor, stepper motor or the like is attached to a vertical linear bearing 444, for example, by a screw gear 446 such as a ball screw and motor for rotating the ball screw. During operation to adjust the size of the gap 410, the actuation mechanism 442 travels along the vertical linear bearing 444. FIG. 4A illustrates the arrangement when the actuation mechanism 442 is at a high position on the linear bearing 444 resulting in a small gap 410 *a*. FIG. 4B illustrates the arrangement when the actuation mechanism 442 is at a mid position on the linear bearing 444. As shown, the lower electrode 406, the RF bias housing 430, the conduit support plate 438, the RF power supply 420 have all moved lower with respect to the chamber housing 404 and the upper electrode 408, resulting in a medium size gap 410 *b*.

FIG. 4C illustrates a large gap 410 *c* when the actuation mechanism 442 is at a low position on the linear bearing. Preferably, the upper and lower electrodes 408, 406 remain coaxial during the gap adjustment and the facing surfaces of the upper and lower electrodes across the gap remain parallel.

This embodiment allows the gap 410 between the lower and upper electrodes 406, 408 in the CCP chamber 402 during multi-step process recipes (BARC, HARC, and STRIP etc.) to be adjusted, for example, in order to maintain uniform etch across a large diameter substrate such as 300 mm wafers or flat panel displays. In particular, this chamber pertains to a mechanical arrangement that permits the linear motion necessary to provide the adjustable gap between lower and upper electrodes 406, 408.

FIG. 4A illustrates laterally deflected bellows 450 sealed at a proximate end to the conduit support plate 438 and at a distal end to a stepped flange 428 of chamber wall plate 418. The inner diameter of the stepped flange defines an opening 412 in the chamber wall plate 418 through which the RF bias housing arm 434 passes. The distal end of the bellows 450 is clamped by a clamp ring 452.

The laterally deflected bellows 450 provides a vacuum seal while allowing vertical movement of the RF bias housing 430, conduit support plate 438 and actuation mechanism 442. The RF bias housing 430, conduit support plate 438 and actuation mechanism 442 can be referred to as a cantilever assembly. Preferably, the RF power supply 420 moves with the cantilever assembly and can be attached to the conduit support plate 438. FIG. 4B shows the bellows 450 in a neutral position when the cantilever assembly is at a mid position. FIG. 4C shows the bellows 450 laterally deflected when the cantilever assembly is at a low position.

A labyrinth seal 448 provides a particle barrier between the bellows 450 and the interior of the plasma processing chamber housing 404. A fixed shield 456 is immovably attached to the inside inner wall of the chamber housing 404 at the chamber wall plate 418 so as to provide a labyrinth groove 460 (slot) in which a movable shield plate 458 moves vertically to accommodate vertical movement of the cantilever assembly. The outer portion of the movable shield plate 458 remains in the slot at all vertical positions of the lower electrode 406.

In the embodiment shown, the labyrinth seal 448 includes a fixed shield 456 attached to an inner surface of the chamber wall plate 418 at a periphery of the opening 412 in the chamber wall plate 418 defining a labyrinth groove 460. The movable shield plate 458 is attached and extends radially from the RF bias housing arm 434 where the arm 434 passes through the opening 412 in the chamber wall plate 418. The movable shield plate 458 extends into the labyrinth groove 460 while spaced apart from the fixed shield 456 by a first gap and spaced apart from the interior surface of the chamber wall plate 418 by a second gap allowing the cantilevered assembly to move vertically. The labyrinth seal 448 blocks migration of particles spalled from the bellows 450 from entering the vacuum chamber interior 405 and blocks radicals from process gas plasma from migrating to the bellows 450 where the radicals can form deposits which are subsequently spalled.

FIG. 4A shows the movable shield plate 458 at a higher position in the labyrinth groove 460 above the RF bias housing arm 434 when the cantilevered assembly is in a high position (small gap 410 *a*). FIG. 4C shows the movable shield plate 458 at a lower position in the labyrinth groove 460 above the RF bias housing arm 434 when the cantilevered assembly is in a low position (large gap 410 *c*). FIG. 4B shows the movable shield plate 458 in a neutral or mid position within the labyrinth groove 460 when the cantilevered assembly is in a mid position (medium gap 410 *b*). While the labyrinth seal 448 is shown as symmetrical about the RF bias housing arm 434, in other embodiments the labyrinth seal 448 may be asymmetrical about the RF bias arm 434.

Figure 5:
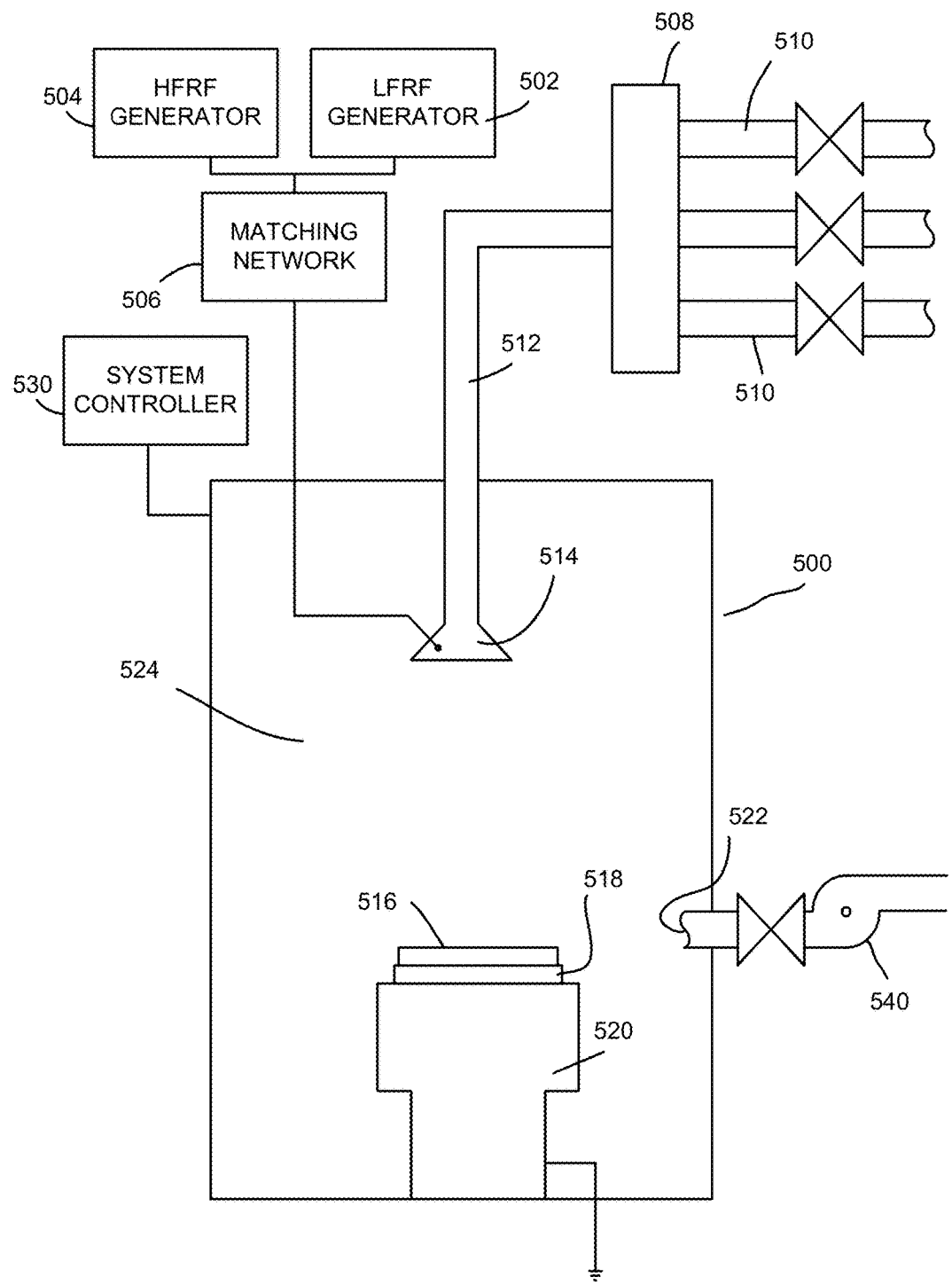
FIG. 5 depicts a reaction chamber that may be used to perform the deposition processes described herein according to certain embodiments.

FIG. 5 provides a simple block diagram depicting various reactor components arranged for implementing deposition methods described herein. As shown, a reactor 500 includes a process chamber 524 that encloses other components of the reactor and serves to contain a plasma generated by a capacitive-discharge type system including a showerhead 514 working in conjunction with a grounded heater block 520. A high frequency (HF) radio frequency (RF) generator 504 and a low frequency (LF) RF generator 502 may be connected to a matching network 506 and to the showerhead 514. The power and frequency supplied by matching network 506 may be sufficient to generate a plasma from process gases supplied to the process chamber 524. For example, the matching network 506 may provide 50 W to 500 W of HFRF power. In some examples, the matching network 506 may provide 100 W to 5000 W of HFRF power and 100 W to 5000 W of LFRF power total energy. In a typical process, the HFRF component may generally be between 5 MHz to 60 MHz, e.g., 13.56 MHz. In operations where there is an LF component, the LF component may be from about 100 kHz to 2 MHz, e.g., 430 kHz.

Within the reactor, a wafer pedestal 518 may support a substrate 516. The wafer pedestal 518 may include a chuck, a fork, or lift pins (not shown) to hold and transfer the substrate during and between the deposition and/or plasma treatment reactions. The chuck may be an electrostatic chuck, a mechanical chuck, or various other types of chuck as are available for use in the industry and/or for research.

Various process gases may be introduced via inlet 512. Multiple source gas lines 510 are connected to manifold 508. The gases may be premixed or not. Appropriate valving and mass flow control mechanisms may be employed to ensure that the correct process gases are delivered during the deposition and plasma treatment phases of the process. In the case where a chemical precursor(s) is delivered in liquid form, liquid flow control mechanisms may be employed. Such liquids may then be vaporized and mixed with process gases during transportation in a manifold heated above the vaporization point of the chemical precursor supplied in liquid form before reaching the deposition chamber.

Process gases may exit chamber 524 via an outlet 522. A vacuum pump, e.g., a one or two stage mechanical dry pump and/or turbomolecular pump 540, may be used to draw process gases out of the process chamber 524 and to maintain a suitably low pressure within the process chamber 524 by using a closed-loop-controlled flow restriction device, such as a throttle valve or a pendulum valve.

As discussed above, the techniques for deposition discussed herein may be implemented on a multi-station or single station tool. In specific implementations, a 300 mm Lam Vector™ tool having a 4-station deposition scheme or a 200 mm Sequel™ tool having a 6-station deposition scheme may be used. In some implementations, tools for processing 450 mm wafers may be used. In various implementations, the wafers may be indexed after every deposition and/or post-deposition plasma treatment, or may be indexed after etching operations if the etching chambers or stations are also part of the same tool, or multiple depositions and treatments may be conducted at a single station before indexing the wafer.

In some embodiments, an apparatus may be provided that is configured to perform the techniques described herein. A suitable apparatus may include hardware for performing various process operations as well as a system controller 530 having instructions for controlling process operations in accordance with the disclosed embodiments. The system controller 530 will typically include one or more memory devices and one or more processors communicatively connected with various process control equipment, e.g., valves, RF generators, wafer handling systems, etc., and configured to execute the instructions so that the apparatus will perform a technique in accordance with the disclosed embodiments. Machine-readable media containing instructions for controlling process operations in accordance with the present disclosure may be coupled to the system controller 530. The system controller 530 may be communicatively connected with various hardware devices, e.g., mass flow controllers, valves, RF generators, vacuum pumps, etc. to facilitate control of the various process parameters that are associated with the deposition operations as described herein.

In some embodiments, a system controller 530 may control all of the activities of the reactor 500. The system controller 530 may execute system control software stored in a mass storage device, loaded into a memory device, and executed on a processor. The system control software may include instructions for controlling the timing of gas flows, wafer movement, RF generator activation, etc., as well as instructions for controlling the mixture of gases, the chamber and/or station pressure, the chamber and/or station temperature, the wafer temperature, the target power levels, the RF power levels, the substrate pedestal, chuck, and/or susceptor position, and other parameters of a particular process performed by the reactor apparatus 500. The system control software may be configured in any suitable way. For example, various process tool component subroutines or control objects may be written to control operation of the process tool components necessary to carry out various process tool processes. The system control software may be coded in any suitable computer readable programming language.

The system controller 530 may typically include one or more memory devices and one or more processors configured to execute the instructions so that the apparatus will perform a technique in accordance with the present disclosure. Machine-readable media containing instructions for controlling process operations in accordance with disclosed embodiments may be coupled to the system controller 530.

Figure 6:
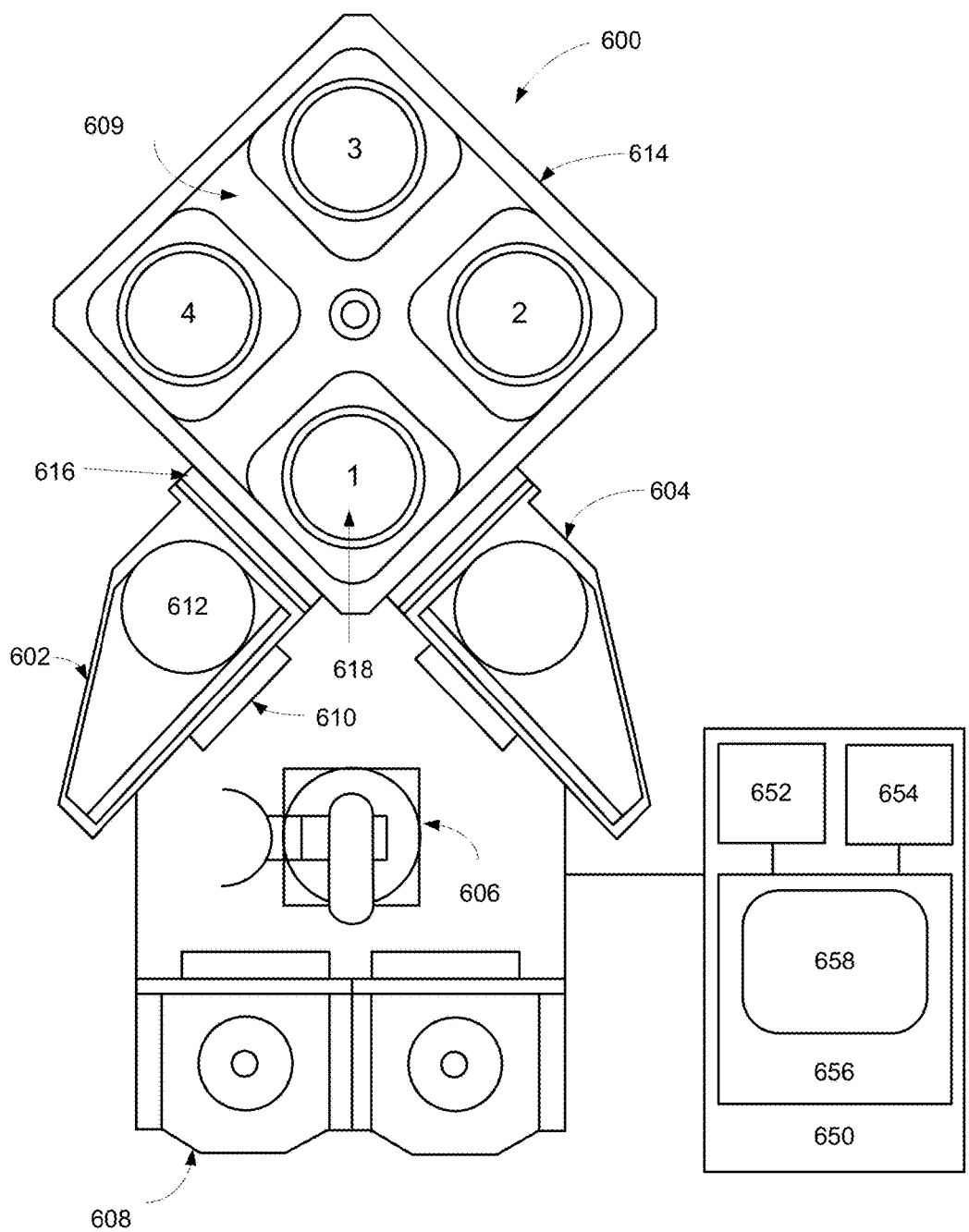
FIG. 6 shows a multi-station apparatus that may be used to perform the deposition processes in certain implementations.

One or more process stations may be included in a multi-station processing tool. FIG. 6 shows a schematic view of an embodiment of a multi-station processing tool 600 with an inbound load lock 602 and an outbound load lock 604, either or both of which may include a remote plasma source. A robot 606, at atmospheric pressure, is configured to move wafers from a cassette loaded through a pod 608 into inbound load lock 602 via an atmospheric port 610. A wafer is placed by the robot 606 on a pedestal 612 in the inbound load lock 602, the atmospheric port 610 is closed, and the load lock is pumped down. Where the inbound load lock 602 includes a remote plasma source, the wafer may be exposed to a remote plasma treatment in the load lock prior to being introduced into a processing chamber 614. Further, the wafer also may be heated in the inbound load lock 602 as well, for example, to remove moisture and adsorbed gases. Next, a chamber transport port 616 to processing chamber 614 is opened, and another robot (not shown) places the wafer into the reactor on a pedestal of a first station shown in the reactor for processing. While the embodiment depicted includes load locks, it will be appreciated that, in some embodiments, direct entry of a wafer into a process station may be provided.

The depicted processing chamber 614 includes four process stations, numbered from 1 to 4 in the embodiment shown in FIG. 6. Each station has a heated pedestal (shown at 618 for station 1), and gas line inlets. It will be appreciated that in some embodiments, each process station may have different or multiple purposes. For example, each of the process stations 1-4 may be a chamber for performing one or more of ALD, CVD, CFD, or etching (any of which may be plasma assisted). In one embodiment, at least one of the process stations is a deposition station having a reaction chamber as shown in FIG. 5, and at least one of the other process stations is an etching station having a reaction chamber as shown in FIGS. 4A-4C. While the depicted processing chamber 614 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 also depicts an embodiment of a wafer handling system 609 for transferring wafers within processing chamber 614. In some embodiments, wafer handling system 609 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 650 employed to control process conditions and hardware states of process tool 600. System controller 650 may include one or more memory devices 656, one or more mass storage devices 654, and one or more processors 652. Processor 652 may include a CPU or computer, analog and/or digital input/output connections, stepper motor controller boards, etc.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing operations during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing operations to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing operations to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, a molecular layer deposition (MLD) chamber or module, a self-assembled monolayer (SAM) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process operation or operations to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

In certain embodiments, the controller has instructions to perform the operations shown and described in relation to FIG. 2. For example, the controller may have instructions to cyclically (a) perform an etching operation to partially etch a feature on a substrate, and (b) deposit a protective sidewall coating in the etched feature without substantially etching the substrate. The instructions may relate to performing these processes using the disclosed reaction conditions. In some cases, the instructions for depositing a first protective layer differ from the instructions for depositing a second protective layer. The instructions may differ in terms of the reaction chamber pressure, the reactant delivery rate, the reactant dose time, the RF time, the RF power, the RF duty cycle, etc. The differences in the instructions for depositing the first protective layer vs. the second protective layer may result in the first and second protective layers forming to have different characteristics such as conformality, thickness, density, and/or composition. The instructions may also relate to transferring the substrate between etching and deposition chambers in some implementations.

Returning to the embodiment of FIG. 6, in some embodiments, system controller 650 controls all of the activities of process tool 600. System controller 650 executes system control software 658 stored in mass storage device 654, loaded into memory device 656, and executed on processor 652. Alternatively, the control logic may be hard coded in the system controller 650. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 658 may include instructions for controlling the timing, mixture of gases, chamber and/or station pressure, chamber and/or station temperature, wafer temperature, target power levels, RF power levels, RF exposure time, substrate pedestal, chuck and/or susceptor position, and other parameters of a particular process performed by process tool 600. System control software 658 may be configured in any suitable way. For example, various process tool component subroutines or control objects may be written to control operation of the process tool components necessary to carry out various process tool processes. System control software 658 may be coded in any suitable computer readable programming language.

In some embodiments, system control software 658 may include input/output control (IOC) sequencing instructions for controlling the various parameters described above. For example, each phase of a CFD process may include one or more instructions for execution by system controller 650. The instructions for setting process conditions for an ALD process phase may be included in a corresponding ALD recipe phase. In some embodiments, the ALD recipe phases may be sequentially arranged, so that all instructions for an ALD process phase are executed concurrently with that process phase.

Other computer software and/or programs stored on mass storage device 654 and/or memory device 656 associated with system controller 650 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 618 and to control the spacing between the substrate and other parts of process tool 600.

A process gas control program may include code for controlling gas composition and flow rates and optionally for flowing gas into one or more process stations prior to deposition in order to stabilize the pressure in the process station. In some embodiments, the controller includes instructions for depositing a nanolaminate protective layer on a core layer, and depositing a conformal layer over the protective layer.

A pressure control program may include code for controlling the pressure in the process station by regulating, for example, a throttle valve in the exhaust system of the process station, a gas flow into the process station, etc. In some embodiments, the controller includes instructions for depositing a nanolaminate protective layer on a core layer, and depositing a conformal layer over the protective layer.

A heater control program may include code for controlling the current to a heating unit that is used to heat the substrate. Alternatively, the heater control program may control delivery of a heat transfer gas (such as helium) to the substrate. In certain implementations, the controller includes instructions for depositing a nanolaminate protective layer at a first temperature, and a conformal layer over the protective layer at a second temperature, where the second temperature is higher than the first temperature.

A plasma control program may include code for setting RF power levels and exposure times in one or more process stations in accordance with the embodiments herein. In some embodiments, the controller includes instructions for depositing a nanolaminate protective layer at a first RF power level and RF duration, and depositing a conformal layer over the protective layer at a second RF power level and RF duration. The second RF power level and/or the second RF duration may be higher/longer than the first RF power level/duration.

In some embodiments, there may be a user interface associated with system controller 650. The user interface may include a display screen, graphical software displays of the apparatus and/or process conditions, and user input devices such as pointing devices, keyboards, touch screens, microphones, etc.

In some embodiments, parameters adjusted by system controller 650 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface.

Signals for monitoring the process may be provided by analog and/or digital input connections of system controller 650 from various process tool sensors. The signals for controlling the process may be output on the analog and digital output connections of process tool 600. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 650 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the disclosed embodiments. Machine-readable, non-transitory media containing instructions for controlling process operations in accordance with the disclosed embodiments may be coupled to the system controller.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Figure 7:
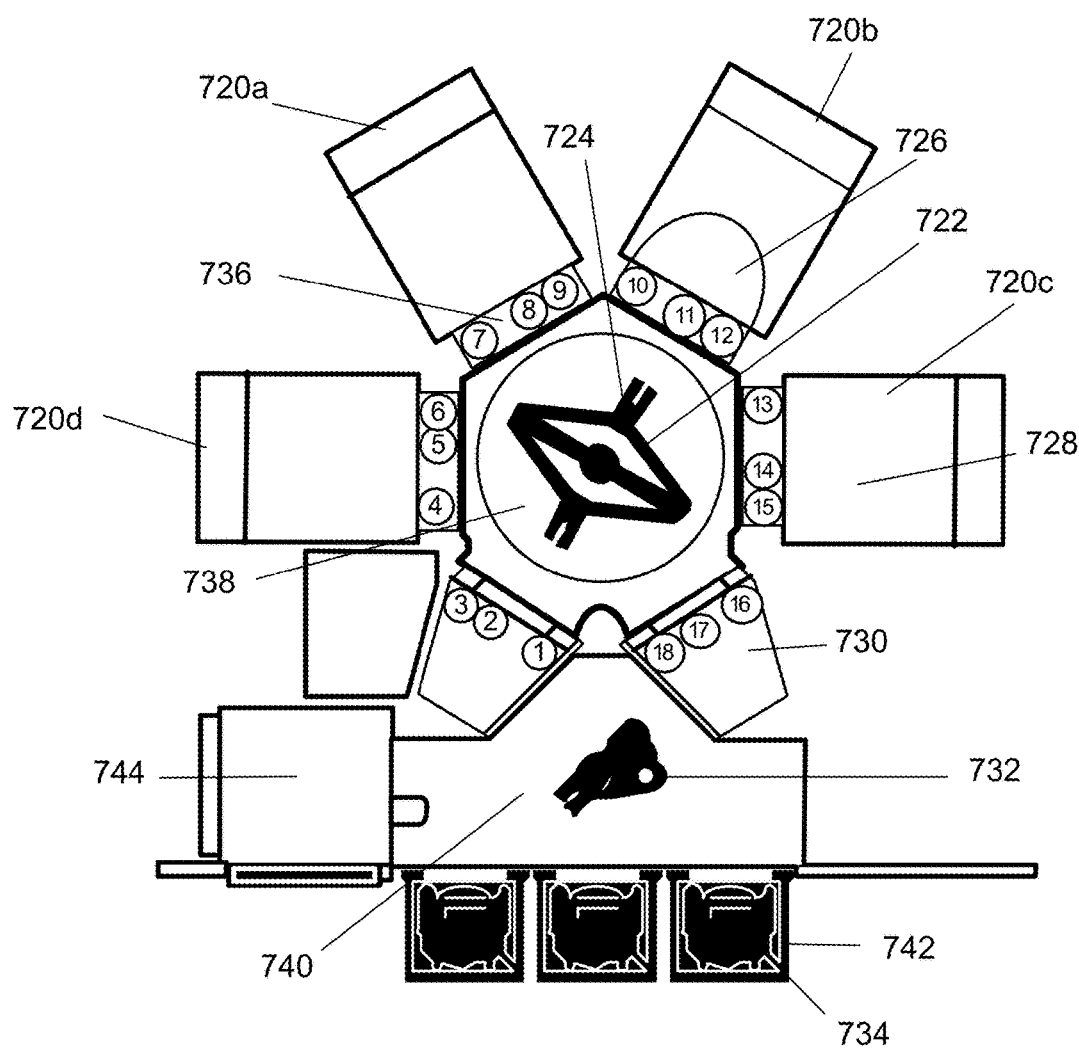
FIG. 7 presents a cluster tool that may be used to practice both deposition and etching according to certain embodiments.

FIG. 7 depicts a semiconductor process cluster architecture with various modules that interface with a vacuum transfer module 738 (VTM). The arrangement of transfer modules to "transfer" substrates among multiple storage facilities and processing modules may be referred to as a "cluster tool architecture" system. Airlock 730, also known as a loadlock or transfer module, is shown in VTM 738 with four processing modules 720a-720d, which may be individual optimized to perform various fabrication processes. By way of example, processing modules 720a-720d may be implemented to perform substrate etching, deposition, ion implantation, substrate cleaning, sputtering, and/or other semiconductor processes as well as laser metrology and other defect detection and defect identification methods. One or more of the processing modules (any of 720a-720d) may be implemented as disclosed herein, i.e., for etching recessed features into substrates, depositing protective films on sidewalls of recessed features, and other suitable functions in accordance with the disclosed embodiments. Airlock 730 and process modules 720a-720d may be referred to as "stations." Each station has a facet 736 that interfaces the station to VTM 738. Inside the facets, sensors 1-18 are used to detect the passing of substrate 726 when moved between respective stations.

Robot 722 transfers substrates between stations. In one implementation, the robot may have one arm, and in another implementation, the robot may have two arms, where each arm has an end effector 724 to pick substrates for transport. Front-end robot 732, in atmospheric transfer module (ATM) 740, may be used to transfer substrates from cassette or Front Opening Unified Pod (FOUP) 734 in Load Port Module (LPM) 742 to airlock 730. Module center 728 inside process modules 720a-720d may be one location for placing the substrate. Aligner 744 in ATM 740 may be used to align substrates.

In an exemplary processing method, a substrate is placed in one of the FOUPs 734 in the LPM 742. Front-end robot 732 transfers the substrate from the FOUP 734 to the aligner 744, which allows the substrate 726 to be properly centered before it is etched, or deposited upon, or otherwise processed. After being aligned, the substrate is moved by the front-end robot 732 into an airlock 730. Because airlock modules have the ability to match the environment between an ATM and a VTM, the substrate is able to move between the two pressure environments without being damaged. From the airlock module 730, the substrate is moved by robot 722 through VTM 738 and into one of the process modules 720a-720d, for example process module 720a. In order to achieve this substrate movement, the robot 722 uses end effectors 724 on each of its arms. In process module 720a, the substrate undergoes etching as described herein to form a partially etched feature. Next, the robot 722 moves the substrate out of processing module 720a, into the VTM 738, and then into a different processing module 720b. In processing module 720b, a protective film is deposited on sidewalls of the partially etched feature. Then, the robot 722 moves the substrate out of processing module 720b, into the VTM 738, and into processing module 720a, where the partially etched feature is further etched. The etching/deposition can be repeated until the feature is fully etched.

It should be noted that the computer controlling the substrate movement can be local to the cluster architecture, or can be located external to the cluster architecture in the manufacturing floor, or in a remote location and connected to the cluster architecture via a network.

Lithographic patterning of a film typically comprises some or all of the following operations, each operation enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

Experimental and Modeling Results

Figure 8A:
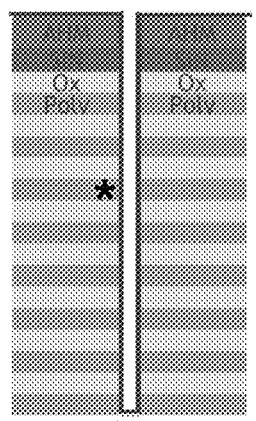
FIGS. 8A-8C depict partially etched features coated with protective sidewall films that are conformal (FIG. 8A), super-conformal (FIG. 8B), or sub-conformal (FIG. 8C).
Figure 8D:
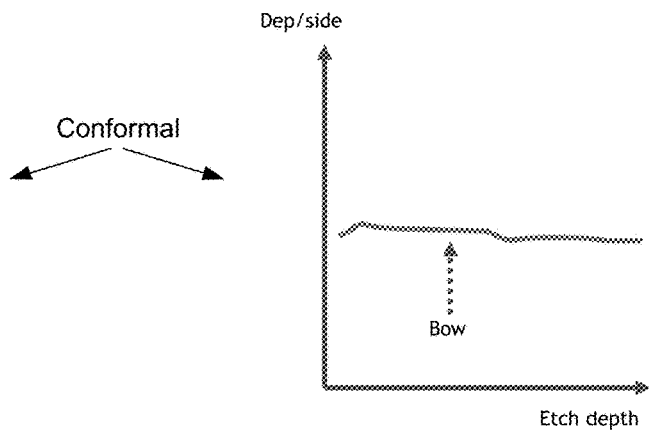
FIGS. 8D-8F are graphs that show the deposition thickness per side within the partially etched features as a function of etch depth for protective sidewall films that are conformal (FIG. 8D), super-conformal (FIG. 8E), or sub-conformal (FIG. 8F).
Figure 8B:
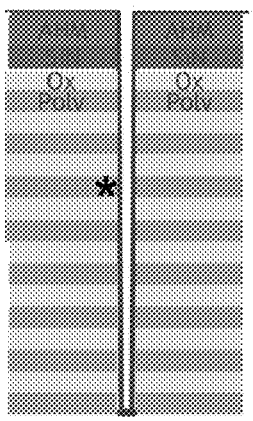
Figure 8E:
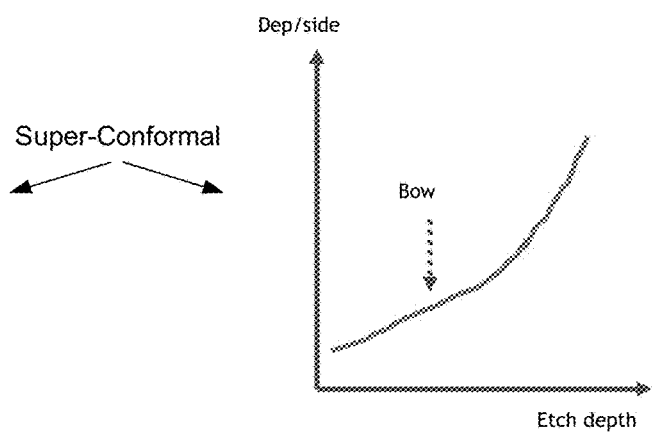
Figure 8C:
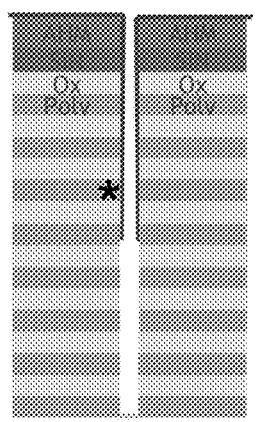
Figure 8F:
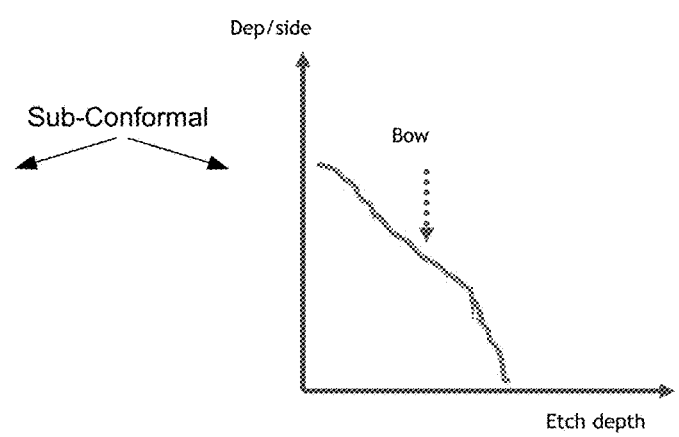

FIGS. 8A-8C depict conformal (FIG. 8A), super-conformal (FIG. 8B) and sub-conformal (FIG. 8C) deposition regimes in high aspect ratio cylinders. Each figure shows the protective film formed on the sidewalls of the feature, which in this example is formed in alternating layers of oxide and polysilicon, and topped with a layer of silicon nitride (SiN) and an ashable hard mask (AHM). FIGS. 8D-8F present graphs depicting the thickness of the protective film at different feature depths where the deposition is conformal (FIG. 8D, corresponding to the embodiment of FIG. 8A), super-conformal (FIG. 8E, corresponding to the embodiment of FIG. 8B), or sub-conformal (FIG. 8F, corresponding to the embodiment of FIG. 8C). FIGS. 8A-8F do not relate to experimental or modeling results, but generally describe the different deposition regimes. The conformal regime is sometimes referred to as "highly conformal," which is understood to mean that the film thickness is relatively uniform throughout the entire feature. For super-conformal films, the film is deposited relatively thicker near the bottom sidewalls of the feature and thinner near the top sidewalls of the feature. By contrast, for sub-conformal films, the film is deposited relatively thicker near the top sidewalls of the feature and thinner (or not at all) near the bottom sidewalls of the feature.

Certain embodiments herein may use a combination of conformal, super-conformal, and/or sub-conformal depositions for the protective layers. In one example, at least one protective film is highly conformal and at least one other protective film is sub-conformal. In another example, at least one protective film is sub-conformal, and at least one other protective film is sub-conformal to an even greater degree (e.g., extends less deep into the feature as a percentage of the instantaneous feature depth).

Figure 9A:
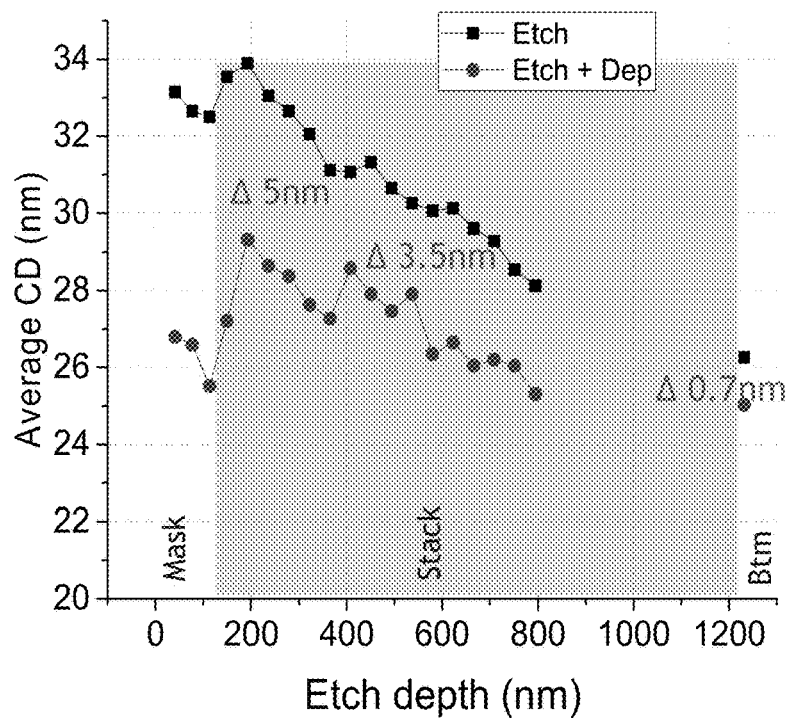
FIG. 9A shows modeling results depicting the average CD vs. etch depth both before and after deposition of a sub-conformal protective film.

FIG. 9A illustrates modeling results showing the average critical diameter vs. etch depth for features etched according to a sub-conformal deposition regime. The upper line shows the average critical diameter of the features after an etching process and before deposition of the protective film on the sidewalls of the feature. The lower line shows the average critical diameter of the features after deposition of the protective film on the sidewalls. Notably, the protective film was deposited thicker near the top of the feature (where the CD was greatest before deposition) and thinner near the bottom of the feature. The thickness of the protective film corresponds to the difference between the average CD before deposition of the protective film vs. the average CD after deposition. For example, the protective film was about 5 nm thick in the region under the mask layer, near the top of the stack (at the bow region approximately 200 nm deep). Deeper into the feature (e.g., at an etch depth of approximately 600 nm), the protective film was thinner, having an average thickness of about 3.5 nm. Near the bottom of the feature (e.g., at an etch depth of approximately 1200 nm), the protective film was substantially thinner, having an average thickness of only about 0.7 nm. These results suggest that sub-conformal films can be formed at the relevant feature geometries described herein. Moreover, the results suggest that sub-conformal films can be specifically targeted to deposit relatively thick at (and above) the bow region, while depositing relatively thin (or not at all) below the bow region. After several iterations of etching and deposition, the result is an etched feature with a relatively straight/vertical profile. By contrast, in cases where the protective film is always deposited in a conformal manner, the resulting feature typically has a tapered profile (feature is thicker near the top and narrower near the bottom).

Figure 9B:
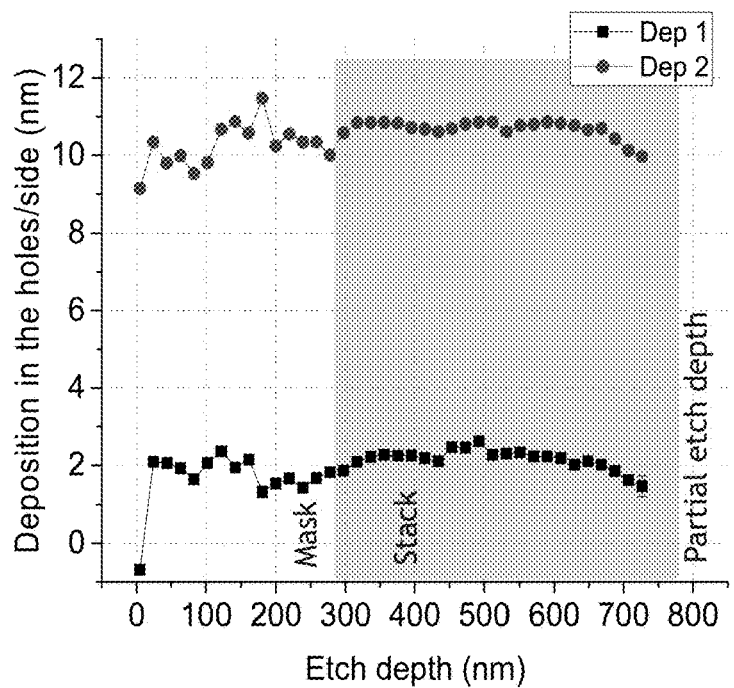
FIG. 9B presents modeling results showing the thickness of the protective film vs. etch depth for conformal protective films.

The tapered profile may arise in cases where the protective film forms conformally because the protective film forms to an equal thickness on all areas of the feature sidewalls. FIG. 9B illustrates modeling results showing the thickness of the protective film as a function of etch depth for protective layers that are deposited according to a conformal regime. As described above, the thickness is relatively constant throughout the entire feature for both deposition films shown in FIG. 9B. Where this is the case, the bow region is protected to about the same degree as areas below the bow region. However, in subsequent etching operations, the processing conditions are harshest at the bow region (e.g., due to feature geometry and directionality of the etching process), and the feature is etched most substantially in this area. The result is that through several iterations of etching/deposition, the bow region continues to grow relative to regions below the bow. Although the bow does not grow as quickly as it would without a protective film, it continues to grow compared to regions below the bow that are equally well protected but face less harsh etching conditions. The use of sub-conformal protective films allows the protective film to be targeted where it is most useful (e.g. at the bow region where etch conditions are most harsh). In effect, the protective film acts as a sacrificial material that may be wholly or partially etched away during each etching operation.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of forming an etched feature in a substrate comprising dielectric material, the method comprising:
    (a) generating a first plasma comprising an etching reactant, exposing the substrate to the first plasma, and partially etching the feature in the substrate;
    (b) after (a), depositing a protective film on sidewalls of the feature, wherein the protective film is deposited through a plasma assisted atomic layer deposition reaction comprising:
        (i) exposing the substrate to a first deposition reactant and allowing the first deposition reactant to adsorb onto the sidewalls of the feature;
        (ii) after (i), exposing the substrate to a second plasma comprising a second deposition reactant, wherein exposing the substrate to the second plasma drives a surface reaction between the first deposition reactant and the second deposition reactant, thereby forming the protective film on the sidewalls of the feature; and
    (c) repeating (a)-(b) until the feature is etched to a final depth, wherein the protective film deposited in (b) substantially prevents lateral etch of the feature during (a), and wherein the feature has an aspect ratio of about 5 or greater at its final depth.

2. An apparatus for forming an etched feature in a substrate comprising dielectric material, the apparatus comprising:
    one or more reaction chambers, wherein at least one reaction chamber is configured to perform etching, and wherein at least one reaction chamber is configured to perform deposition, each reaction chamber comprising:
        an inlet for introducing process gases to the reaction chamber,
        an outlet for removing material from the reaction chamber, and
        a plasma source; and
    a controller configured to cause:
    (a) generating a first plasma comprising an etching reactant, exposing the substrate to the first plasma, and partially etching the feature in the substrate, wherein (a) is performed in the reaction chamber configured to perform etching;
    (b) after (a), depositing a protective film on sidewalls of the feature, wherein the protective film is deposited through a plasma assisted atomic layer deposition reaction comprising:
        (i) exposing the substrate to a first deposition reactant and allowing the first deposition reactant to adsorb onto the sidewalls of the feature;
        (ii) after (i), exposing the substrate to a second plasma comprising a second deposition reactant, wherein exposing the substrate to the second plasma drives a surface reaction between the first deposition reactant and the second deposition reactant, thereby forming the protective film on the sidewalls of the feature, wherein (b) is performed in the reaction chamber configured to perform deposition; and
    (c) repeating (a)-(b) until the feature is etched to a final depth, wherein the protective film deposited in (b) substantially prevents lateral etch of the feature during (a), and wherein the feature has an aspect ratio of about 5 or greater at its final depth.

3. A method of forming an etched feature in a substrate comprising dielectric material, the method comprising:
    (a) generating a first plasma comprising an etching reactant, exposing the substrate to the first plasma, and partially etching the feature in the substrate;
    (b) after (a), depositing a protective film on sidewalls of the feature; and
    (c) repeating (a)-(b) until the feature is etched to a final depth, wherein the feature has an aspect ratio of about 5 or greater at its final depth, and wherein the protective film deposited in a first iteration of (b) is more conformal than the protective film deposited in a second iteration of (b),
    wherein at least one of the following conditions is satisfied:
        (i) the protective film deposited in the first iteration of (b) is deposited at a higher pressure compared to the protective film deposited in the second iteration of (b);

(ii) the protective film deposited in the first iteration of (b) is deposited at a lower rate of reactant delivery compared to the protective film deposited in the second iteration of (b);

(iii) the protective film deposited in the first iteration of (b) is deposited at a shorter duration of reactant delivery compared to the protective film deposited in the second iteration of (b);

(iv) the protective film deposited in the first iteration of (b) is deposited at a shorter duration of plasma exposure compared to the protective film deposited in the second iteration of (b);

(v) the protective film deposited in the first iteration of (b) is deposited at a higher RF power compared to the protective film deposited in the second iteration of (b); and/or (vi) the protective film deposited in the first iteration of (b) is deposited at a higher RF duty cycle compared to the protective film deposited in the second iteration of (b).

4. The method of claim 3, wherein the first iteration of (b) is performed before the second iteration of (b).

5. The method of claim 3, wherein the first iteration of (b) is performed after the second iteration of (b).

6. The method of claim 3, wherein the protective film deposited in the first iteration of (b) is conformal and the protective film deposited in the second iteration of (b) is sub-conformal.

7. The method of claim 6, wherein the protective film deposited in the second iteration of (b) does not extend to a bottom of the partially etched feature.

8. The method of claim 3, wherein the protective film deposited in the first iteration of (b) is deposited at a higher pressure compared to the protective film deposited in the second iteration of (b).

9. The method of claim 3, wherein the protective film deposited in the first iteration of (b) is deposited at a lower rate of reactant delivery compared to the protective film deposited in the second iteration of (b).

10. The method of claim 3, wherein the protective film deposited in the first iteration of (b) is deposited at a shorter duration of reactant delivery compared to the protective film deposited in the second iteration of (b).

11. The method of claim 3, wherein the protective film deposited in the first iteration of (b) is deposited at a shorter duration of plasma exposure compared to the protective film deposited in the second iteration of (b).

12. The method of claim 3, wherein the protective film deposited in the first iteration of (b) is deposited at a higher RF power compared to the protective film deposited in the second iteration of (b).

13. The method of claim 3, wherein the protective film deposited in the first iteration of (b) is deposited at a higher RF duty cycle compared to the protective film deposited in the second iteration of (b).

14. The method of claim 3, wherein the protective film deposited in the first iteration of (b) is deposited using a first set of deposition conditions, wherein the protective film deposited in the second iteration of (b) is deposited using a second set of deposition conditions, wherein the first and second sets of deposition conditions are different with respect to at least two parameters selected from the group consisting of: pressure, rate of reactant delivery, duration of reactant delivery, duration of plasma exposure, RF power, and RF duty cycle.

15. The method of claim 14, wherein the first set of deposition conditions has a lower rate of reactant delivery and either (i) a shorter duration of reactant delivery, and/or (ii) a shorter duration of plasma exposure.

16. The method of claim 3, wherein at least one iteration of (a) results in formation of a bow within the feature, and wherein a subsequent iteration of (b) results in formation of the protective film at least as deep as the bow, but not as deep as the feature.

17. The method of claim 3, wherein the protective film is deposited via a thermal atomic layer deposition reaction or a plasma assisted atomic layer deposition reaction.

18. The method of claim 3, wherein the protective film is deposited via a molecular layer deposition reaction.

19. The method of claim 3, wherein the protective film is deposited via a self-assembled monolayer reaction.

20. The method of claim 3, wherein the protective film is deposited via a thermal chemical vapor deposition reaction or a plasma enhanced chemical vapor deposition reaction.

21. An apparatus for forming an etched feature in a substrate comprising dielectric material, the apparatus comprising:
one or more reaction chambers, wherein at least one reaction chamber is configured to perform etching, and wherein at least one reaction chamber is configured to perform deposition, each reaction chamber comprising:
an inlet for introducing process gases to the reaction chamber, and
an outlet for removing material from the reaction chamber, and
a controller configured to cause:
(a) generating a first plasma comprising an etching reactant, exposing the substrate to the first plasma, and partially etching the feature in the substrate, wherein (a) is performed in the reaction chamber configured to perform etching;
(b) after (a), depositing a protective film on sidewalls of the feature, wherein (b) is performed in the reaction chamber configured to perform deposition; and
(c) repeating (a)-(b) until the feature is etched to a final depth, wherein the feature has an aspect ratio of about 5 or greater at its final depth, and wherein the protective film deposited in a first iteration of (b) is more conformal than the protective film deposited in a second iteration of (b),
wherein at least one of the following conditions is satisfied:
(i) the protective film deposited in the first iteration of (b) is deposited at a higher pressure compared to the protective film deposited in the second iteration of (b);
(ii) the protective film deposited in the first iteration of (b) is deposited at a lower rate of reactant delivery compared to the protective film deposited in the second iteration of (b);
(iii) the protective film deposited in the first iteration of (b) is deposited at a shorter duration of reactant delivery compared to the protective film deposited in the second iteration of (b);
(iv) the protective film deposited in the first iteration of (b) is deposited at a shorter duration of plasma exposure compared to the protective film deposited in the second iteration of (b);
(v) the protective film deposited in the first iteration of (b) is deposited at a higher RF power compared to the protective film deposited in the second iteration of (b); and/or (vi) the protective film deposited in the first iteration of (b) is deposited at a higher RF duty cycle compared to the protective film deposited in the second iteration of (b).

22. The apparatus of claim 21, wherein the reaction chamber configured to perform etching is the same reaction chamber configured to perform deposition, such that both (a) and (b) occur in the same reaction chamber.

23. The apparatus of claim 21, wherein the reaction chamber configured to perform etching is different from the reaction chamber configured to perform deposition, and wherein the controller is configured to cause transferring the substrate between the reaction chamber configured to perform etching and the reaction chamber configured to perform deposition.

* * * * *